United States Patent
More et al.

(10) Patent No.: US 10,672,886 B2
(45) Date of Patent: Jun. 2, 2020

(54) STRUCTURE AND METHOD FOR HIGH-K METAL GATE

(71) Applicant: Taiwan Semiconductor Manufacturing Company, Ltd., Hsinchu (TW)

(72) Inventors: Shahaji B. More, Hsinchu (TW); Cheng-Han Lee, New Taipei (TW); Zheng-Yang Pan, Zhubei (TW); Shih-Chieh Chang, Taipei (TW); Chun-Chieh Wang, Kaohsiung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/722,652

(22) Filed: Oct. 2, 2017

(65) Prior Publication Data
US 2019/0067457 A1   Feb. 28, 2019

Related U.S. Application Data

(60) Provisional application No. 62/552,997, filed on Aug. 31, 2017.

(51) Int. Cl.
*H01L 21/336* (2006.01)
*H01L 29/66* (2006.01)
(Continued)

(52) U.S. Cl.
CPC ........ *H01L 29/66545* (2013.01); *H01L 21/28* (2013.01); *H01L 29/10* (2013.01);
(Continued)

(58) Field of Classification Search
CPC ........... H01L 29/66545; H01L 29/4966; H01L 29/517; H01L 29/785; H01L 29/66795; H01L 29/513; H01L 29/7848; H01L 21/28088; H01L 29/518; H01L 29/165; H01L 29/0847; H01L 21/845; H01L 29/0653; H01L 29/1054; H01L 21/823821; H01L 29/6656; H01L 21/823857; H01L 27/0924; H01L 27/1211; H01L 29/401; G11C 16/10; G11C 16/0408; G11C 16/0466; G11C 16/0483; G11C 11/5671; G11C 16/14; G11C 11/22; G11C 11/401; G11C 11/405; G11C 11/4085; G11C 11/409; G11C 11/4094; G11C 11/412; G11C 11/418; G11C 11/419; G11C 16/16; G11C 16/26; G11C 16/3418; C23C 16/405; C23C 14/083; C23C 14/5826; C23C 16/0218; C23C 16/308; C23C 16/40;
(Continued)

(56) References Cited

U.S. PATENT DOCUMENTS 8,487,378 B2   7/2013   Goto et al.
8,729,634 B2   5/2014   Shen et al.
(Continued)

*Primary Examiner* — Robert G Bachner
(74) *Attorney, Agent, or Firm* — Slater Matsil, LLP

(57) ABSTRACT

A method of forming a gate dielectric material includes forming a high-K dielectric material in a first region over a substrate, where forming the high-K dielectric material includes forming a first dielectric layer comprising hafnium over the substrate, and forming a second dielectric layer comprising lanthanum over the first dielectric layer.

20 Claims, 23 Drawing Sheets

(51) Int. Cl.
  *H01L 29/51* (2006.01)
  *H01L 29/10* (2006.01)
  *H01L 29/78* (2006.01)
  *H01L 21/28* (2006.01)
  *H01L 21/8238* (2006.01)

(52) U.S. Cl.
  CPC .............. *H01L 29/51* (2013.01); *H01L 29/78* (2013.01); *H01L 29/785* (2013.01); *H01L 21/823857* (2013.01)

(58) Field of Classification Search
  CPC . C23C 16/403; C23C 16/45531; C23C 16/50; C23C 16/56; G01N 33/48721; G01N 21/636; G01N 21/6489; G01N 21/8851; G01N 21/9501; G01N 21/9505; G01N 27/221; G01N 27/227; B82Y 10/00; G01R 27/2605; G01R 29/24; G01R 31/302
  See application file for complete search history.

(56) References Cited

U.S. PATENT DOCUMENTS

| | | | |
|---|---|---|---|
| 8,826,213 B1 | 9/2014 | Ho et al. | |
| 8,887,106 B2 | 11/2014 | Ho et al. | |
| 2004/0161883 A1* | 8/2004 | Colombo | C23C 28/00 438/197 |
| 2004/0185629 A1* | 9/2004 | Mansoori | H01L 21/26506 438/289 |
| 2007/0037343 A1* | 2/2007 | Colombo | H01L 21/823842 438/231 |
| 2007/0212896 A1* | 9/2007 | Olsen | H01J 37/32082 438/758 |
| 2009/0321810 A1* | 12/2009 | Ryu | H01L 27/11519 257/321 |
| 2011/0101438 A1* | 5/2011 | Yoo | G11C 16/0416 257/316 |
| 2012/0043614 A1* | 2/2012 | Choi | H01L 28/20 257/369 |
| 2012/0225268 A1* | 9/2012 | Antonov | H01G 4/306 428/213 |
| 2014/0282326 A1 | 9/2014 | Chen et al. | |
| 2017/0170027 A1* | 6/2017 | Hou | H01L 21/324 |

* cited by examiner

STRUCTURE AND METHOD FOR HIGH-K METAL GATE

PRIORITY CLAIM AND CROSS-REFERENCE

This application claims priority to U.S. Provisional Patent Application No. 62/552,997, filed Aug. 31, 2017, entitled "Structure and Method for High-K Gate," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming the high-K dielectric material of FinFET devices. However, one skilled in the art will readily appreciate that the methods disclosed in the present disclosure may be used in other devices or applications, e.g., planar devices.

Figure 1:
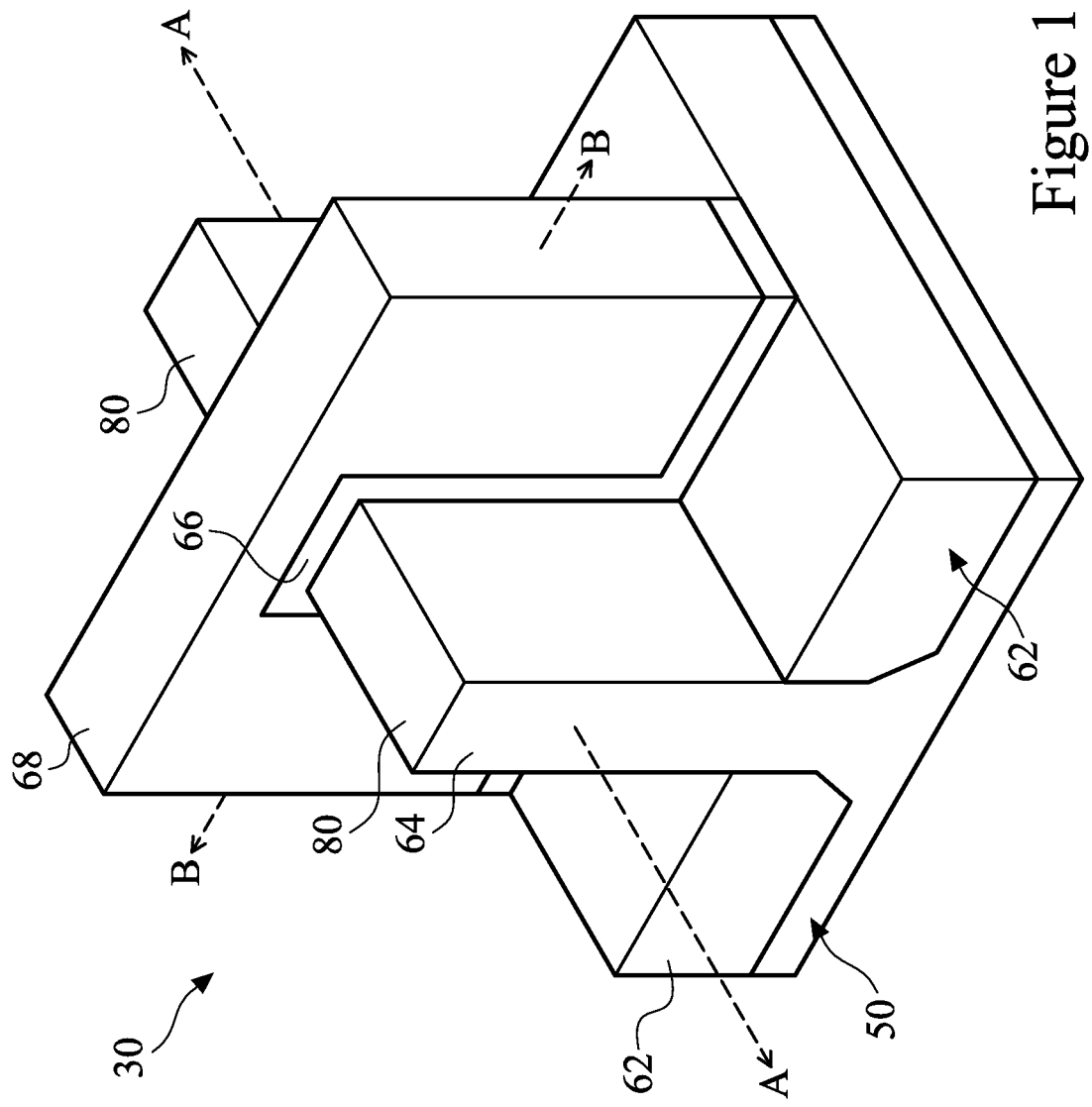
FIG. 1 illustrates a perspective view of a Fin Field-Effect Transistor (FinFET), in accordance with some embodiments.

FIG. 1 illustrates an example of a FinFET 30 in a perspective view. The FinFET 30 includes a substrate 50 having a fin 64. The substrate 50 has isolation regions 62 formed thereon, and the fin 64 protrudes above and between neighboring isolation regions 62. A gate dielectric 66 is along sidewalls and over a top surface of the fin 64, and a gate electrode 68 is over the gate dielectric 66. Source/drain regions 80 are in the fin on opposite sides of the gate dielectric 66 and gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Subsequent figures refer to these reference cross-sections for clarity.

FIGS. 2-20 are cross-sectional views of a FinFET device 100 at various stages of fabrication in accordance with an embodiment. The FinFET device 100 is similar to the FinFET 30 in FIG. 1, except for multiple fins. FIGS. 2-6 illustrate cross-section views of FinFET device 100 along cross-section B-B, and FIGS. 7-20 illustrate cross-section views along cross-section A-A.

Figure 2:
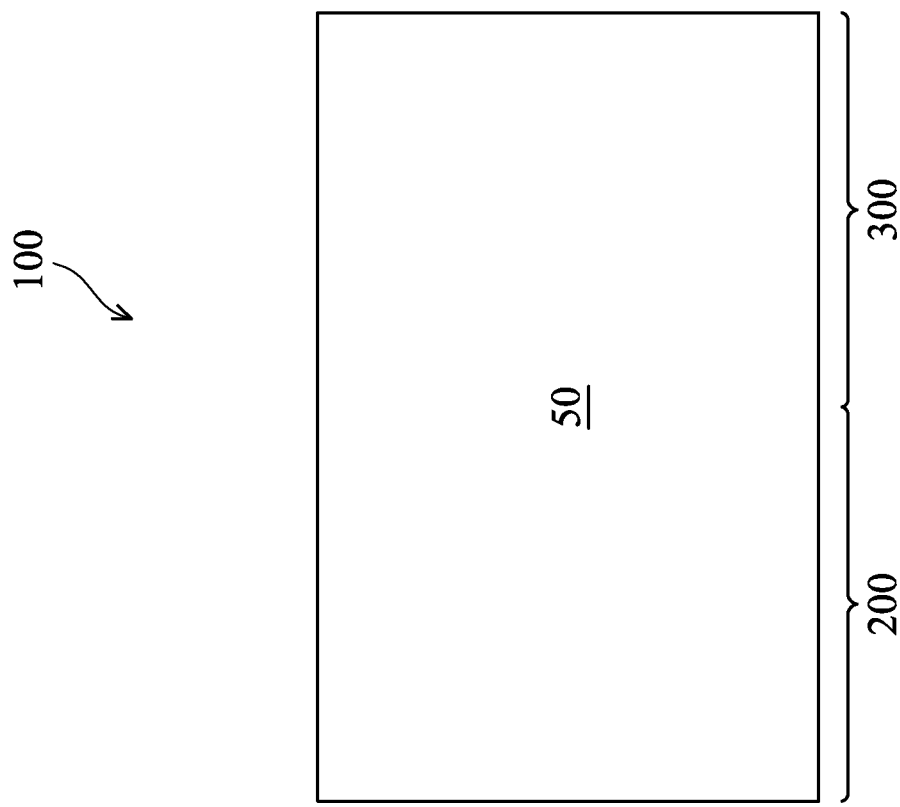
FIGS. 2-9, 10A, 10B, 11A, 11B, and 12-20 illustrate cross-sectional views of a FinFET device at various stages of fabrication, in accordance with some embodiments.

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As illustrated in FIG. 2, the substrate includes a first portion in region 200, and a second portion in region 300. The first portion of the substrate 50 in region 200 may be used to form P-type devices such as P-type metal-oxide-semiconductor field-effect transistors (MOSFETs), and the second portion of the substrate 50 in region 300 may be used to form N-type devices such as N-type MOSFETs. Therefore, the region 200 may be referred to as a PMOS region, and the region 300 may be referred to as an NMOS region. In other embodiments, P-type devices (or N-type devices) are formed in both region 200 and region 300.

Figure 3:
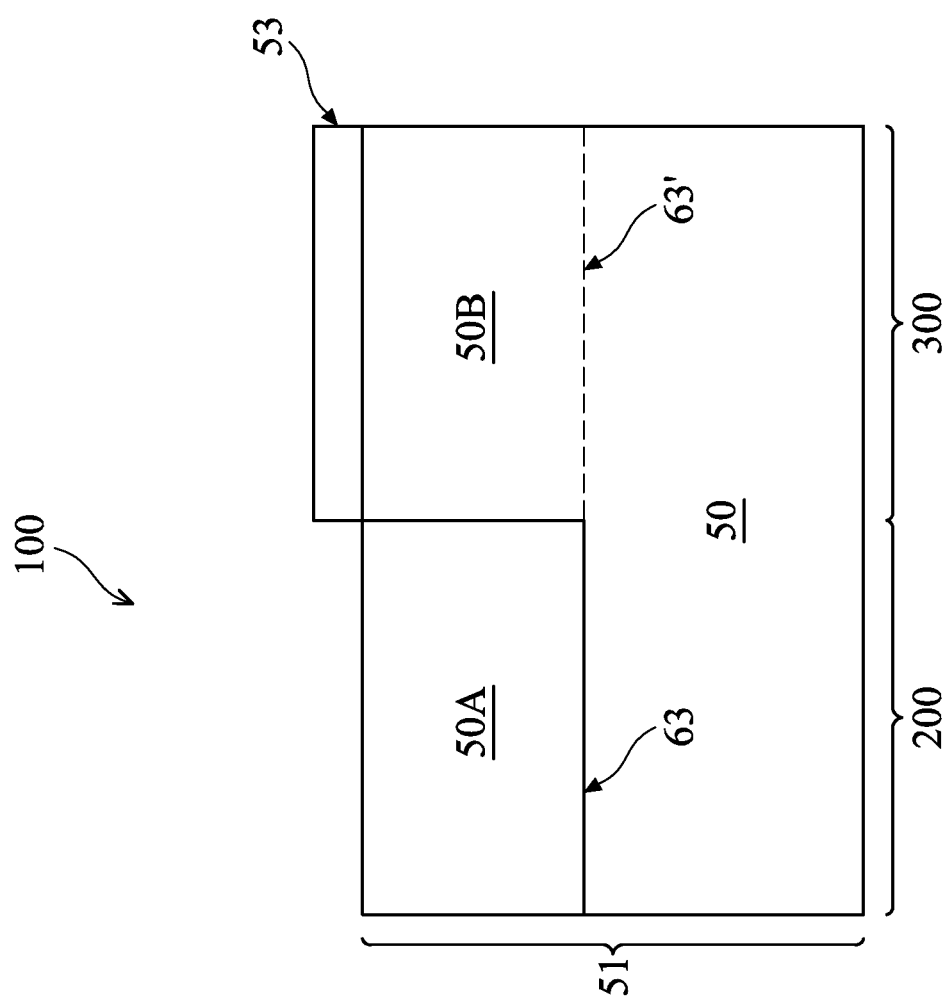

Next, referring to FIG. 3, a portion of the substrate 50 in the region 200 is replaced with a semiconductor material 50A, such as an epitaxial semiconductor material that is suitable for forming a corresponding type of device (e.g., P-type device) in the region 200. For example, the semiconductor material 50A may be or comprise epitaxially grown silicon germanium. To form the semiconductor material 50A, a mask layer 53, which may be a photo-sensitive layer such as photoresist, is formed over the substrate 50 using chemical vapor deposition (CVD), physical vapor deposition (PVD), spin coating, or other suitable deposition method. The mask layer 53 is then patterned using, e.g., photolithography and patterning techniques. The patterned mask layer 53 covers the region 300 but exposes the region 200, as illustrated in FIG. 3. An exposed portion of the substrate 50 in the region 200 is then removed by a suitable etching process, such as reactive ion etch (RIE), neutral beam etch (NBE), the like, or a combination thereof, to form a recess (not shown) in the region 200.

Next, an epitaxy is performed to grow the semiconductor material 50A in the recesses in the region 200. The epitaxially grown semiconductor material 50A may be in situ doped during growth, which may obviate the need for prior and subsequent implantations although in situ and implantation doping may be used together. After the epitaxy, the mask layer 53 may be removed by a suitable removal process, such as etching or plasma ashing. A planarization process, such as chemical mechanical polish (CMP), may then be performed to level the top surface of the semiconductor material 50A. FIG. 3 also shows an interface 63 between the semiconductor material 50A and the substrate 50, which may or may not be a straight line as illustrated in FIG. 3.

Optionally, another patterned mask layer (not shown) may be formed to cover the region 200 while exposing the region 300, and an exposed portion of substrate 50 in the region 300 may be removed and replaced with an epitaxial grown semiconductor material 50B, which is illustrated in phantom in FIG. 3. The semiconductor material 50B may be or comprise an epitaxial semiconductor material that is suitable for forming a corresponding type of device (e.g., N-type device) in the region 300. For example, the semiconductor material 50B may be or comprise epitaxially grown silicon carbide. FIG. 3 also shows an interface 63' between the semiconductor material 50B, if formed, and the substrate 50, which interface 63' may or may not be a straight line as illustrated in FIG. 3.

In other embodiments, the semiconductor material 50B (e.g., an epitaxial semiconductor material) replaces a portion of the substrate 50 in the region 300, and a portion of the substrate 50 in the region 200 may optionally be replaced by the semiconductor material 50A (e.g., an epitaxial semiconductor material). In yet other embodiments, the above described epitaxial semiconductor materials (e.g., 50A and 50B) are not formed, thus the processing illustrated in FIG. 3 may be omitted. The discussion below uses an embodiment configuration for the substrate 50 where the semiconductor material 50A is formed in the first region 200 and the semiconductor material 50B is not formed in the region 300, with the understanding that the processing illustrated in FIGS. 4-20 may also be applied to other substrate configurations described above. In the discussion hereinafter, substrate 51 is used to refer to substrate 50 and the semiconductor materials 50A/50B, if formed.

The semiconductor materials 50A and 50B (e.g., epitaxial semiconductor materials) may have a lattice constant(s) greater than, substantially equal to, or smaller than, the lattice constant of substrate 50. The lattice constant(s) of the semiconductor materials 50A and 50B is determined by the material(s) selected by the conductivity types (e.g., N-type or P-type) of the resulting FinFETs. Further, it may be advantageous to epitaxially grow a material in an NMOS region different from the material in a PMOS region. In various embodiments, the semiconductor materials (e.g., 50A, 50B) may comprise silicon germanium, silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 4:
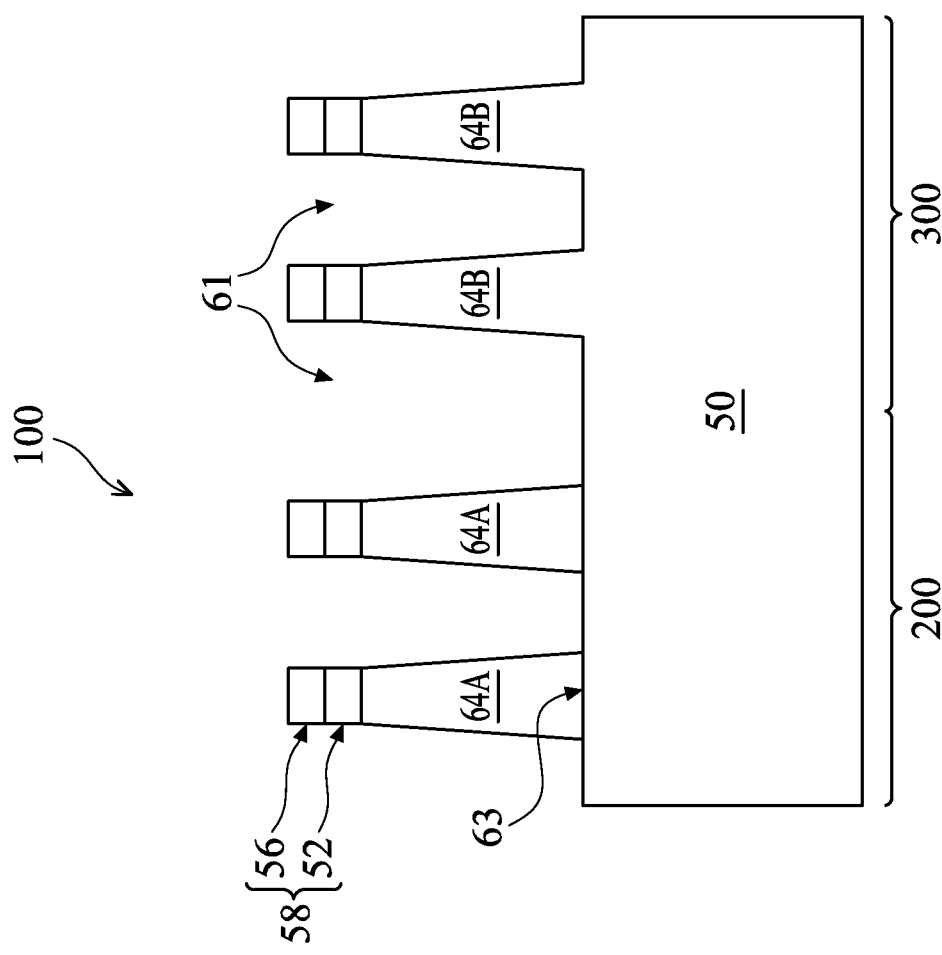

Next, referring to FIG. 4, the substrate 51 is patterned using, e.g., photolithography and etching techniques. For example, a mask layer, such as a pad oxide layer (not shown) and an overlying pad nitride layer (not shown), is formed over the substrate 51. The pad oxide layer may be a thin film comprising silicon oxide formed, for example, using a thermal oxidation process. The pad oxide layer may act as an adhesion layer between the substrate 51 and the overlying pad nitride layer. In some embodiments, the pad nitride layer is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer and pad nitride to form a patterned mask 58. As illustrated in FIG. 4, the patterned mask 58 includes patterned pad oxide 52 and patterned pad nitride 56.

The patterned mask 58 is subsequently used to pattern exposed portions of the substrate 51 to form trenches 61, thereby defining semiconductor fins 64 (also referred to as fins) between adjacent trenches as illustrated in FIG. 4. In some embodiments, the semiconductor fins 64 (e.g., 64A and 64B) are formed by etching trenches in the substrate 51 using, for example, reactive ion etch (RIE), neutral beam etch (NBE), the like, or a combination thereof. The etch may be anisotropic. In some embodiments, the trenches may be strips (viewed from the top) parallel to each other, and closely spaced with respect to each other. In some embodiments, the trenches may be continuous and surround the semiconductor fins 64.

The fins 64 may be patterned by any suitable method. For example, the fins may 64 be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

As illustrated in FIG. 4, fins 64A are formed in the first region 200, and fins 64B are formed in the second region 300. Recall that a top portion of the substrate 50 in the region 200 is replaced by a semiconductor material 50A. Therefore, depending on where the bottom of trenches 61 is relative to the interface 63 between the semiconductor material 50A and the substrate 50 (e.g., at the interface 63, above the interface 63, or below the interface 63), the fin 64 may comprise a first portion above the interface 63 formed of the semiconductor material 50A (e.g., silicon germanium), and a second portion (not shown) below the interface 63 formed of the material (e.g., silicon) of the substrate 50. The fins 64B are formed entirely of the material (e.g., silicon) of the substrate 50, in the illustrated example, or may comprise a top portion (not shown) formed of the semiconductor material 50B, in other embodiments.

Variations in the structure and formation method of the fins 64 are possible and are fully intended to be included within the scope of the present disclosure. For example, FIG. 4 illustrates the case where bottoms of the trenches 61 extend at the interface 63. In other embodiments, the bottoms of the trenches 61 extend above or below the interface 63. Although FIG. 4 illustrates two fins 64A in the region 200 and two fins 64B in the region 300, more or less than two fins may be formed in the region 200 and/or the region 300. As another example, the fins 64 may be formed by etching substrate 50 to form a first plurality of fins (which will be removed and replaced in subsequent processing), forming an isolation material around the first plurality of fins, removing the first plurality of fins to form recesses in the isolation material, and epitaxially growing semiconductor material(s) in the recesses to form fins 64.

Figure 5:
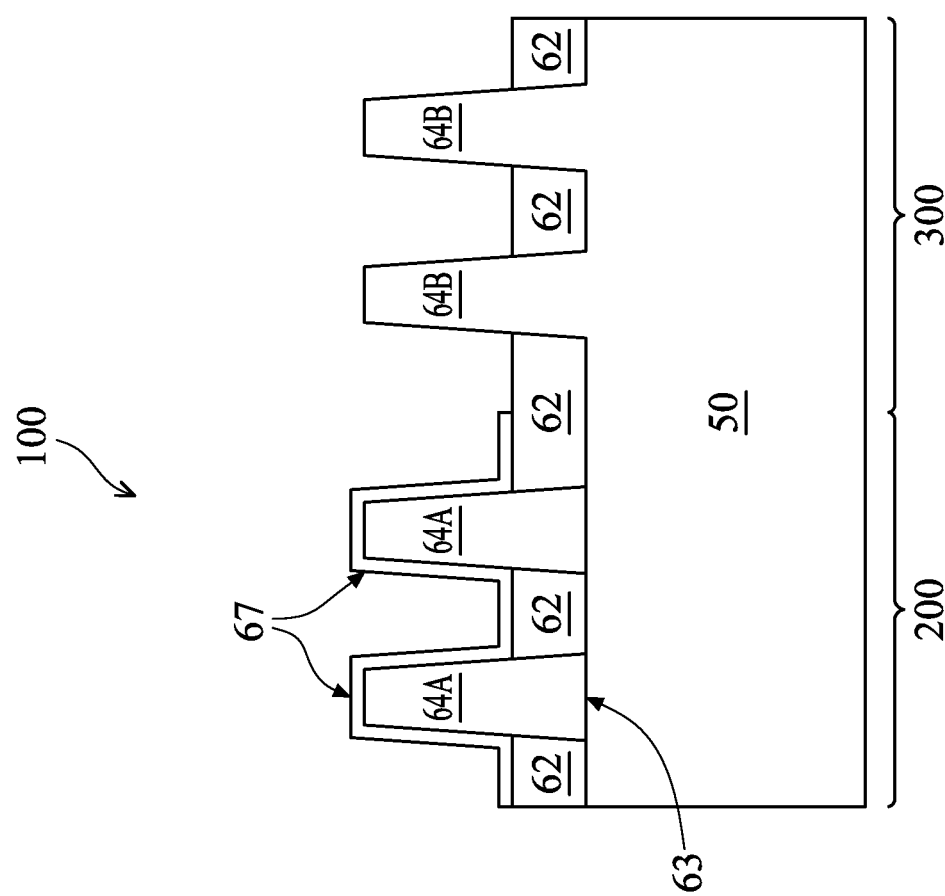

Next, in FIG. 5, isolation regions 62 are formed by filling the trenches 61 with an insulation material and recessing the insulation material. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. A planarization process, such as CMP, may remove any excess insulation material and form a top surface of the isolation material and top surfaces of the semiconductor fins 64 that are coplanar (not shown). The patterned mask 58 (see FIG. 4) may be removed by the CMP process.

In some embodiments, the isolation regions 62 include a liner, e.g., a liner oxide (not shown), at the interface between the isolation regions 62 and the substrate 50/fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50 and/or fins 64, although any suitable method may also be used to form the liner oxide.

Next, the insulation material is recessed to form isolation regions 62 such as shallow trench isolation (STI) regions. The insulation material is recessed such that the upper portions of the semiconductor fins 64A/64B protrude from between neighboring isolation regions 62. The top surfaces of the isolation regions 62 may have a flat surface (as illustrated), a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

Still referring to FIG. 5, a capping layer 67 is formed over the exposed portion of the fins 64A. The capping layer 67 is a semiconductor capping layer such as a silicon capping layer (e.g., a layer of silicon), in some embodiments. Any suitable deposition method, such as CVD, PVD, atomic layer deposition (ALD), the like, or combinations thereof, may be used to form the capping layer 67. A mask layer (not shown) may be used to shield region 300 while the capping layer 67 is formed over the fins 64A in the region 200. After the capping layer 67 is formed, the mask layer is removed. In some embodiments, a thickness of the capping layer 67 is between about 0.5 nm and about 3 nm. In the illustrated example of FIG. 5, the capping layer 67 is conformally formed over the fins 64A which may be formed of silicon germanium, and no capping layer 67 is formed over the fins 64B which may be formed of silicon.

Figure 6:
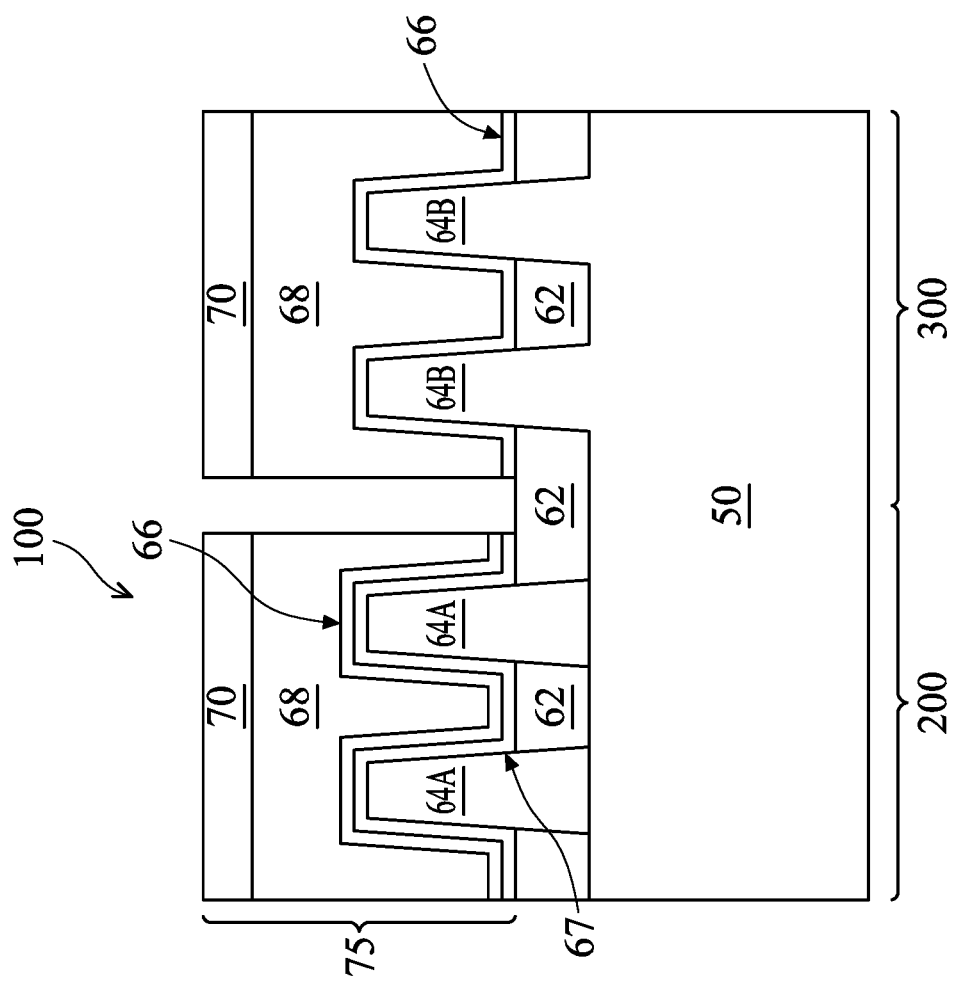

FIG. 6 illustrates the formation of dummy gate structure 75 over the semiconductor fins 64 (e.g., 64A/64B). The dummy gate structure 75 includes gate dielectric 66 and gate 68, in some embodiments. The dummy gate structure 75 may further include mask 70. To form the dummy gate structure 75, a dielectric layer is formed on the semiconductor fins 64 (e.g., over the capping layer 67 of the fins 64A and over the fins 64B) and the isolation regions 62. The dielectric layer may be, for example, silicon oxide, silicon nitride, multilayers thereof, or the like, and may be deposited or thermally grown according to acceptable techniques. The formation methods of dielectric layer may include molecular-beam deposition (MBD), atomic layer deposition (ALD), plasma-enhanced CVD (PECVD), and the like.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

FIGS. 7-20 illustrate the cross-section views of further processing of the FinFET device 100 along cross-section A-A of a semiconductor fin 64 (e.g., along a longitudinal axis of fin 64A or 64B). The processing for forming the high-K dielectric material 94 (see FIG. 11B) and the interfacial material 96 (see FIG. 11B) as illustrated in FIGS. 7-20 are performed for both the PMOS region 200 and the NMOS region 300, in some embodiments. Therefore, one cross-sectional view along cross-section A-A of a fin 64A, instead of two cross-sectional views along cross-section A-A of a fin 64A and along cross-section A-A of a fin 64B, is shown in each of FIGS. 7-20 as examples.

Figure 7:
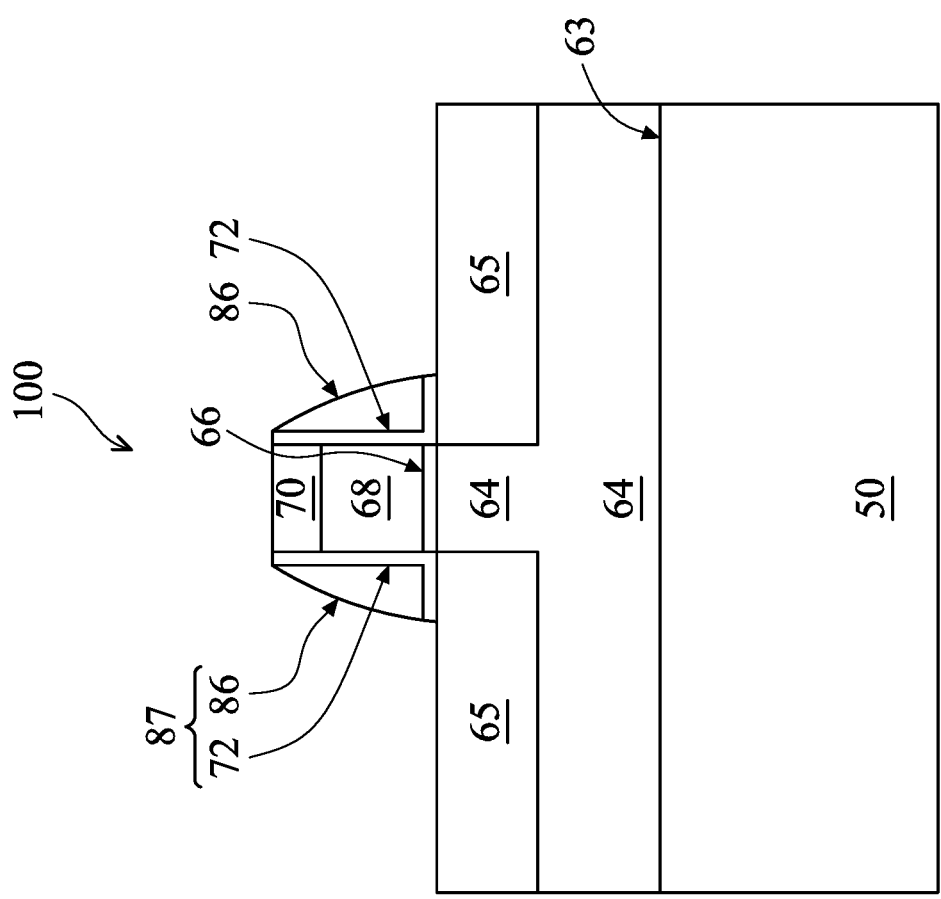

As illustrated in FIG. 7, lightly doped drain (LDD) regions 65 are formed in the fins 64. The LDD regions 65 may be formed by a plasma doping process. The plasma doping process may implant N-type impurities (for N-type devices) or P-type impurities (for P-type devices) in the fins 64 to form the LDD regions 65. For example, a patterned mask layer may be formed to shield the PMOS region 200 while N-type impurities are implanted into the LDD regions 65 of the NMOS region 300. Similarly, another patterned mask layer may be formed to shield the NMOS region 300 while P-type impurities are implanted into the LDD regions 65 of the PMOS region 200.

In some embodiments, the LDD regions 65 abut the channel region of the FinFET device 100. Portions of the LDD regions 65 may extend under gate 68 and into the channel region of the FinFET device 100. FIG. 7 illustrates a non-limiting example of the LDD regions 65. Other configurations, shapes, and formation methods of the LDD regions 65 are also possible and are fully intended to be included within the scope of the present disclosure. For example, LDD regions 65 may be formed after first gate spacers 72 are formed.

Still referring to FIG. 7, after the LDD regions 65 are formed, a gate spacer 87 is formed on the gate structure. The gate spacer 87 may include a first gate spacer 72 and a second gate spacer 86. In the example of FIG. 7, the first gate spacer 72 is formed on opposing sidewalls of the gate 68 and on opposing sidewalls of the gate dielectric 66. The first gate spacer 72 may also extend over the upper surface of the semiconductor fins 64 (with the LDD regions 65 formed within the fins 64) and the upper surface of the isolation regions 62. The second gate spacer 86 is formed on the first gate spacer 72, as illustrated in FIG. 7. The first gate spacer 72 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The second gate spacer 86 may be formed of silicon nitride, SiCN, a combination thereof, or the like using a suitable deposition method.

In an exemplary embodiment, the gate spacer 87 is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of dummy gate structure 75) while keeping a second portion of the second gate spacer layer disposed along sidewalls of the dummy gate structure 75. The second portion of the second gate spacer layer remaining after the anisotropic etch process forms the second gate spacer 86. The anisotropic etch process also removes a portion of the first gate spacer layer disposed outside of the sidewalls of the second gate spacer 86, and the remaining portion of the first gate spacer layer forms the first gate spacer 72.

The shapes and formation methods of the first gate spacer 72 and the second gate spacer 86 as illustrated in FIG. 7 are merely non-limiting examples, and other shapes and formation methods are possible. For example, the second gate spacers 86 may be formed after the epitaxial source/drain regions 80 (see FIG. 8) are formed. In some embodiments, dummy gate spacers are formed on the first gate spacer 72 before the epitaxial process of the epitaxial source/drain regions 80 illustrated in FIG. 8 and the dummy gate spacers are removed and replaced with the second gate spacers 86 after the epitaxial source/drain regions 80 are formed.

Depending whether the substrate 50 and the fin 64 are formed of a same material, there may be an interface 63 (illustrated in phantom in FIG. 7) between the substrate 50 and the fin 64. For simplicity, the interface 63 is not illustrated in FIGS. 8-20, with the understanding that when the substrate 50 and the fin 64 are formed of different materials, the interface 63 may be formed as illustrated in FIG. 7.

Figure 8:
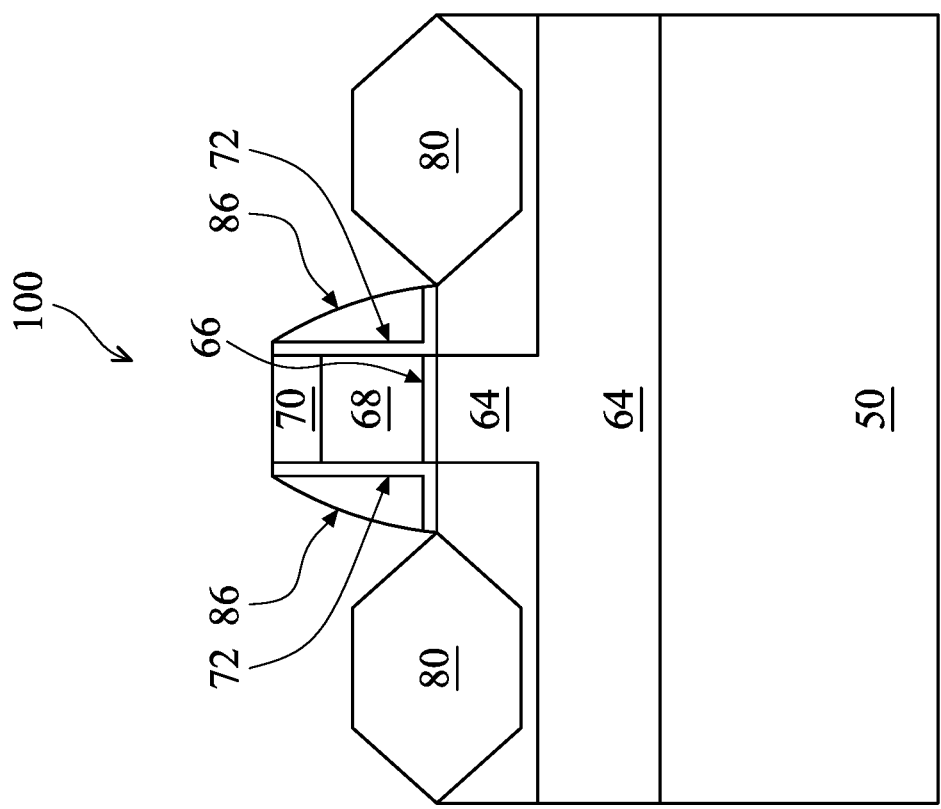

Next, as illustrated in FIG. 8, source/drain regions 80 are formed. The source/drain regions 80 are formed by etching the LDD regions 65 within the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 8, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80. In some embodiments, the source/drain regions 80 for adjacent fins 64 do not merge together and remain separate source/drain regions 80. In some exemplary embodiments in which the resulting FinFET is an n-type FinFET, source/drain regions 80 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal. The implanting process may include forming and patterning masks such as a photoresist to cover the regions of the FinFET that are to be protected from the implanting process. The source/drain regions 80 may have an impurity (e.g., dopant) concentration in a range from about 1E19 $cm^{-3}$ to about 5E21 $cm^{-3}$. In some embodiments, the epitaxial source/drain regions may be in situ doped during growth.

Figure 9:
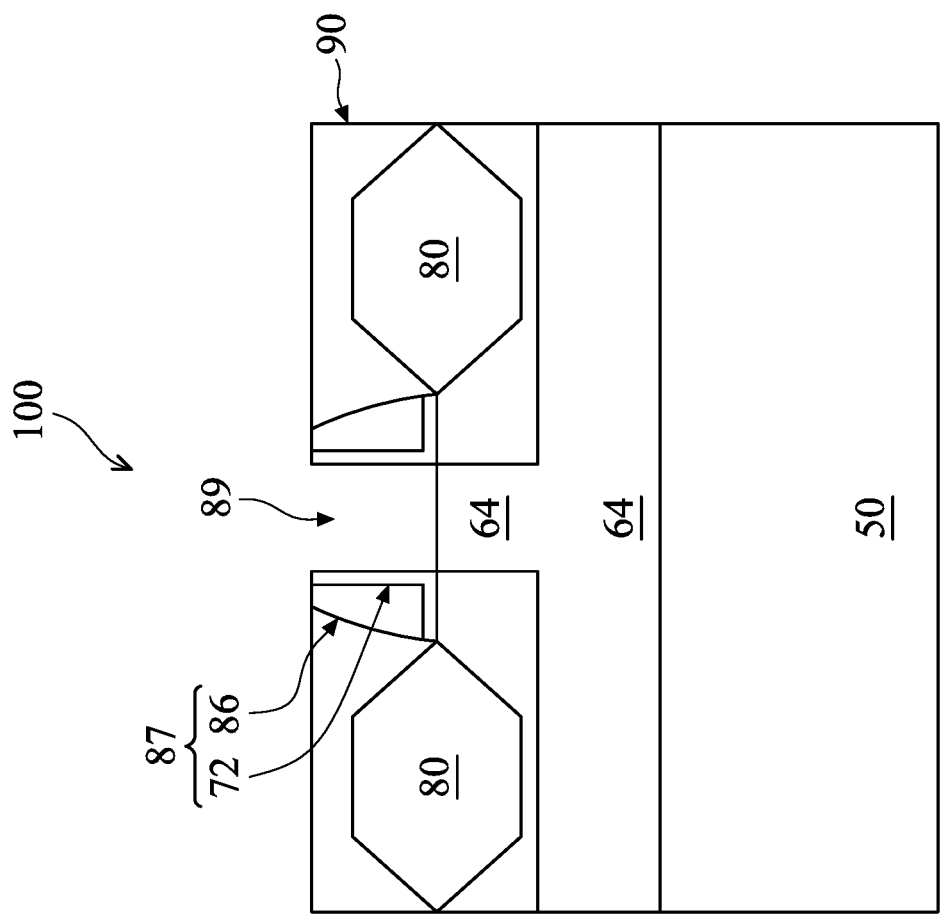

Next, as illustrated in FIG. 9, a first interlayer dielectric (ILD) 90 is formed over the structure illustrated in FIG. 8, and a gate-last process (sometimes referred to as a replacement gate process) is performed. In a gate-last process, the gate 68 and the gate dielectric 66 (see FIG. 8) are considered dummy structures and are removed and replaced with an active gate (also referred to as a replacement gate) and active gate dielectric. In some embodiment, the active gate is a metal gate.

In some embodiments, the first ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to planarize the top surface of the first ILD 90 such that the top surface of the first ILD 90 is level with the top surface of the gate 68 (see FIG. 8). Therefore, after the CMP process, the top surface of the gate 68 is exposed, in some embodiments.

In accordance with some embodiments, the gate 68 and the gate dielectric 66 directly under the gate 68 are removed in an etching step(s), so that recesses 89 are formed between respective spaces 87. Each recess 89 exposes a channel region of a respective fin 64. Each channel region is disposed between neighboring pairs of epitaxial source/drain regions 80. During the dummy gate removal, the dummy gate dielectric layer 66 may be used as an etch stop layer when the dummy gate 68 is etched. The dummy gate dielectric layer 66 may then be removed after the removal of the dummy gate 68.

Figure 10A:
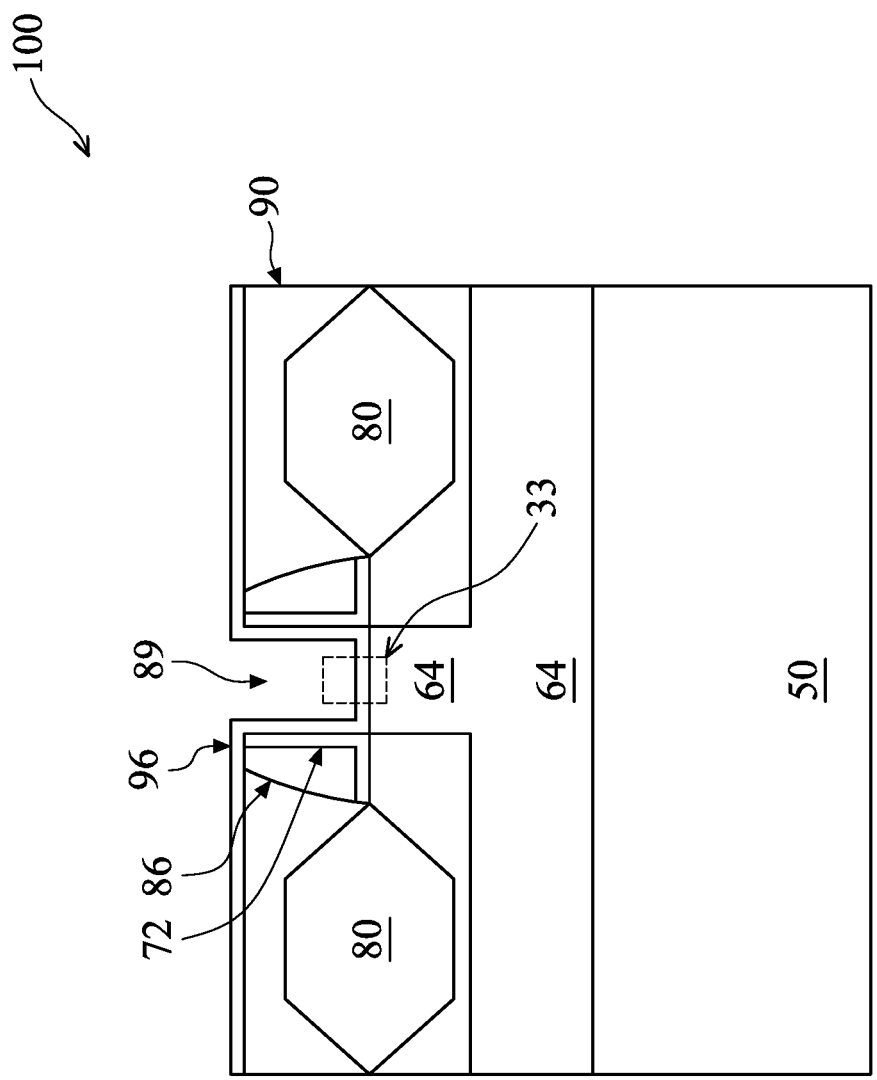

Referring to FIG. 10A, an interface material 96 is formed in the recess 89. The interface material 96 is conformally formed over the semiconductor device 100, thus the interface material 96 lines sidewalls and the bottom surface of the recess 89, in the illustrated embodiment. The interface material 96 may also cover the upper surface of the first ILD 90.

Figure 10B:
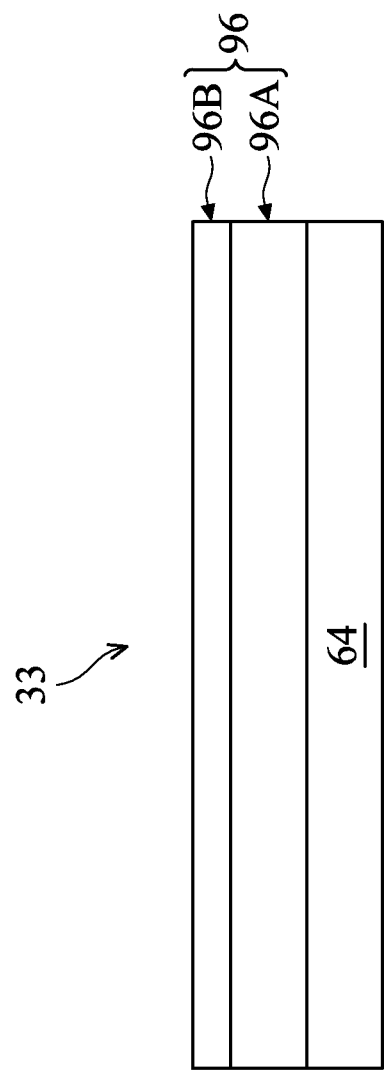

In accordance with some embodiments, the interface material 96 comprises a plurality of layers. FIG. 10B illustrates a zoomed-in view of an area 33 in FIG. 10A. As illustrated in FIG. 10B, the interface material 96 comprises a dielectric layer 96A over the fin 64, and a dielectric layer 96B over the dielectric layer 96A. In an exemplary embodiment, the dielectric layer 96A comprises an oxide of a material of the fin 64, such as silicon oxide ($SiO_2$), and may act as an adhesion layer between the fin 64 and the dielectric layer 96B. In some embodiments, the fin 64 is made of silicon germanium, in which case a thin layer (e.g., about 0.5 nm to about 3 nm thick) of silicon (e.g., the capping layer 67 in FIG. 5) is formed over the fin 64, and the thin layer of silicon is oxidized to form the adhesion layer (e.g., $SiO_2$). The dielectric layer 96A (e.g., silicon oxide) may be formed by a thermal oxidization process, a chemical vapor deposition (CVD) process, a physical vapor deposition (PVD) process, an atomic layer deposition (ALD) process, or any suitable formation method. In some embodiments, a thickness of the dielectric layer 96A is in a range from about 0.2 nm to about 5 nm, such as 0.5 nm.

In some embodiments, the dielectric layer 96B comprises a hafnium (Hf) containing material, such as a hafnium incorporated silicon dioxide. For example, the dielectric layer 96A may comprise $SiO_2$, and the dielectric layer 96B may comprise hafnium silicate (e.g., $SiHfO_4$). Other suitable material, such as zirconium silicate (e.g., $SiZrO_4$), zirconium aluminate (e.g., $ZrAlO_4$), or hafnium aluminate (e.g., $HfAlO_4$), may also be used as the material of the dielectric layer 96B. The dielectric layer 96B may be deposited over the dielectric layer 96A using, e.g., CVD, PVD, ALD, or other suitable deposition method.

In some embodiments, the dielectric layer 96B (e.g., $SiHfO_4$) may be formed by doping the deposited dielectric layer 96A (e.g., $SiO_2$) with Hf, therefore converting a top layer of the dielectric layer 96A into, e.g., $SiHfO_4$. For example, the doping may be performed by a plasma process using a plasma containing Hf, which plasma reacts with and/or diffuses into the dielectric layer 96A, and converts the top layer of the dielectric layer 96A into hafnium silicate. In some embodiment, the doping is an in-situ doping process using $HfO_2$. By controlling the content of Hf in the $HfO_2$, it is possible to form a hafnium silicate (e.g., $SiHfO_4$) layer as the dielectric layer 96B, or to form a thin interface of hafnium silicate between the dielectric layer 96A (e.g., $SiO_2$) and an overlying dielectric layer 94A (e.g., $HfO_2$, see FIG. 11B). In some embodiments, a thickness of the dielectric layer 96B is in a range from about 0.5 nm to about 5 nm, such as 1 nm.

Figure 11A:
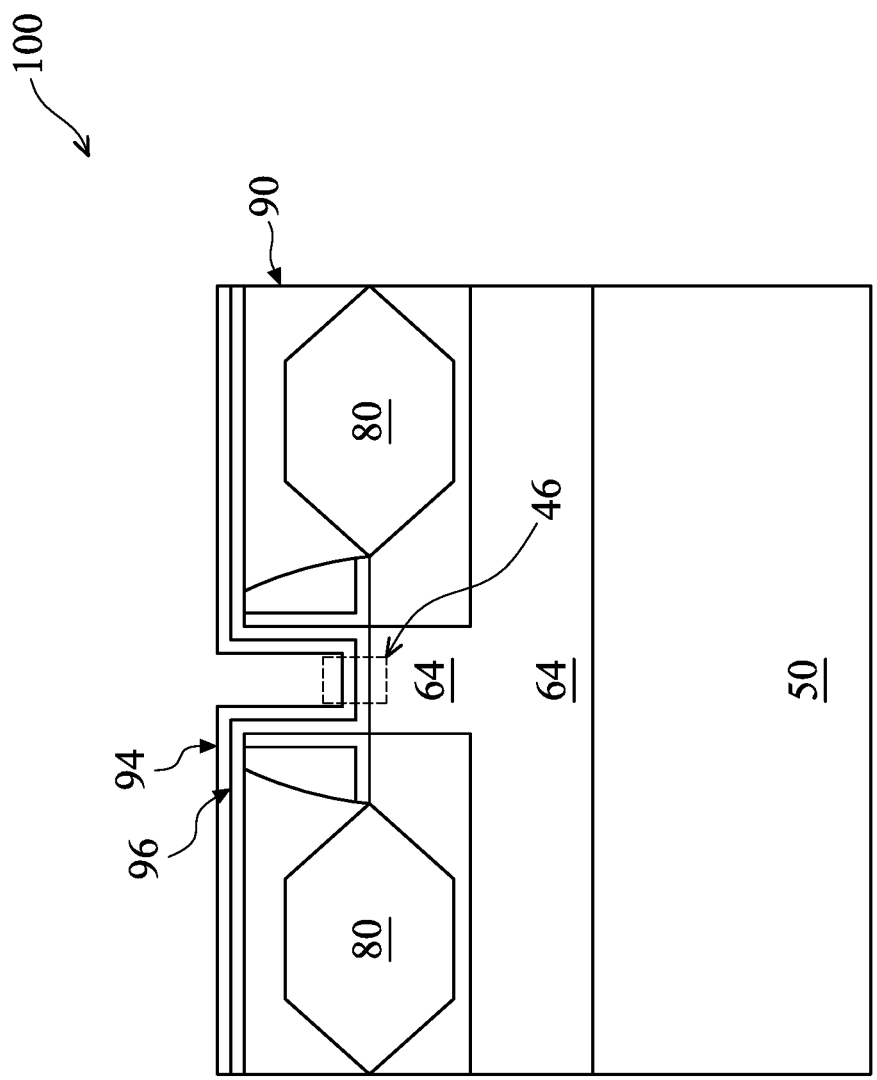
Figure 11B:
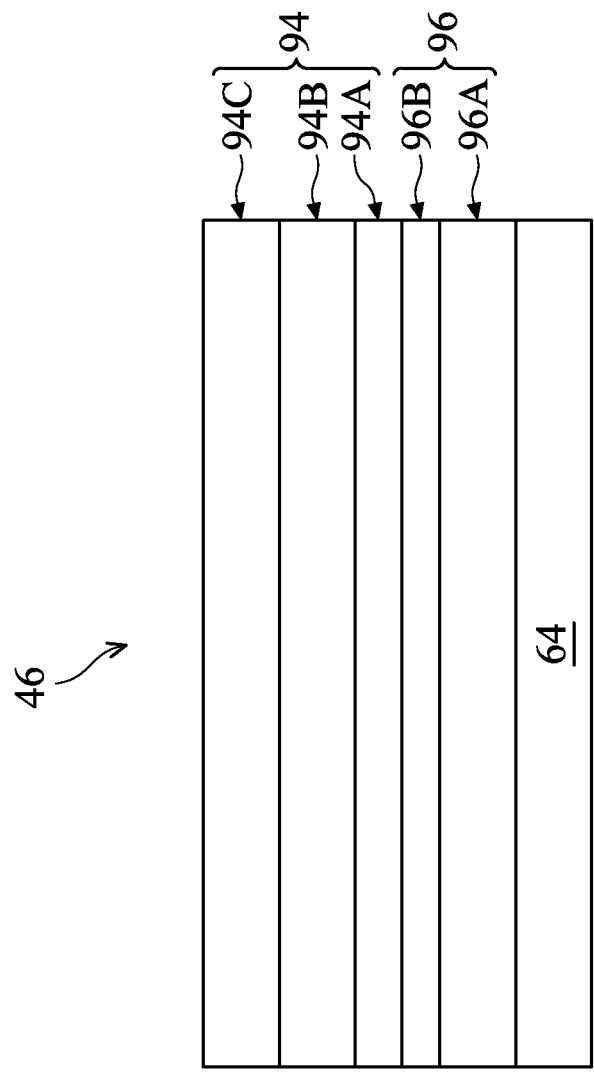

In some embodiments, the dielectric layer 96B (e.g., $SiHfO_4$) acts as a buffer layer between the underlying dielectric layer 96A (e.g., $SiO_2$) and the overlying dielectric layer 94A (e.g., $HfO_2$, see FIG. 11B). Since the ability of $SiHfO_4$ to conduct electrical charge carriers (e.g., holes or electrons) is between that of $SiO_2$ and that of $HfO_2$, the dielectric layer 96B facilitates a gradual change in the ability to conduct electrical charge carriers from the high-K dielectric material 94 to the interface material 96, which gradual change improves the performance (e.g., the ability to quickly turn on the device) of the semiconductor device 100.

Next, in FIG. 11A, the high-K dielectric material 94 is formed conformally over the interface material 96. In some embodiments, the high-K dielectric material 94 comprise a plurality of layers. Details of the high-K dielectric material 94 are illustrated in FIG. 11B, which shows a zoomed-in view of an area 46 of FIG. 11A.

Referring to FIG. 11B, the high-K dielectric material 94 comprises a dielectric layer 94A, a dielectric layer 94B, and a dielectric layer 94C formed successively over the interface material 96. In some embodiments, the dielectric layer 94A comprises hafnium oxide (e.g., $HfO_2$), and is formed by a suitable deposition method such as ALD, CVD, PVD, or the like. A thickness of the dielectric layer 94A is in a range from about 0.5 nm to about 5 nm, such as 3 nm. Besides hafnium oxide, other suitable material, such as $Y_2O_3$, $La_2O_3$, or $Al_2O_3$, may also be used as the material of the dielectric layer 94A.

In accordance with some embodiments, the dielectric layer 94A acts as a diffusion barrier layer to prevent lanthanum contained in the overlying layers (e.g., 94B and 94C) from diffusing into the underlying layers such as the interface material 96 and the fin 64. For example, lanthanum from the dielectric layer 94B (e.g., $HfLaO_X$) may diffuse into top portions of the dielectric layer 94A distal the fin 64, but does not diffuse into the interface material 96. Therefore, the dielectric layer 94A reduces or obviates the need to have a high effective oxide thickness (EOT), e.g., larger than 1 nm, to control the intra-diffusion of lanthanum in the high-K interface.

In some embodiments, the dielectric layer 94B comprises hafnium lanthanum oxide (e.g., $HfLaO_X$), and is formed by PVD, CVD, ALD, or other suitable deposition method. A thickness of the dielectric layer 94B is in a range from about 0.5 nm to about 2 nm. Hafnium lanthanum oxide has a large conduction band which may be advantageous for N-type devices, therefore hafnium lanthanum oxide is usually used for N-type devices but not for P-type devices. In addition, lanthanum diffuses easily and may cause contamination for other layers. As a result, hafnium lanthanum oxide, when used alone as a high-K dielectric material, may need an EOT of larger than 1 nm to control the out-diffusion of lanthanum. The present disclosure overcomes the disadvantages of the hafnium lanthanum oxide by, e.g., the multi-layered structure and the selection of materials for the high-K dielectric material 94 and the interface material 96. More details are discussed hereinafter.

In some embodiments, the dielectric layer 94C comprises lanthanum aluminum oxide (e.g., $LaAl_2O_3$), and is formed by PVD, CVD, ALD, or other suitable deposition method. A thickness of the dielectric layer 94C is in a range from about 0.5 nm to about 2 nm. Since lanthanum aluminum oxide has a large valance band (which may be advantageous for P-type devices) and a large conduction band (which may be advantageous for N-type devices), lanthanum aluminum oxide is suited for use as gate dielectric material in both P-type devices and N-type devices. Besides lanthanum aluminum oxide, other suitable material, such as HfSiON, or La—Si—O, may also be used for the dielectric layer 94C. The high-K dielectric material 94, which comprises a plurality of layers, may also be referred to as a high-K dielectric stack.

As semiconductor processing technology continues to advance, the diminishing sizes of the semiconductor features pose challenges to the performance of the semiconductor devices formed. For example, carrier mobility may decrease as features sizes drop below, e.g., 7 nm. To improve the carrier mobility in advanced manufacturing processes, PMOS fully strained channel (PFSC) may be used for, e.g., P-type devices. However, the use of PFSC may increase the leakage current of the semiconductor device. To reduce the leakage current, it may be beneficial to reduce the EOT of the gate dielectric material to, e.g., about 0.5 nm or smaller, which is not achieved by existing high-K dielectric stack designs. The present disclosure, which includes, among other features, inserting a thin layer of aluminum doped high-K layer (e.g., $LaAl_2O_3$) in the high-K dielectric stack, achieves excellent electrostatic control and an EOT of 0.5 nm or less. As a result, leakage current is reduced while improved mobility is achieved.

In addition, the presently disclosed high-K dielectric material 94 and the interface material 96 may be used for both P-type devices and N-type devices (e.g., in the PMOS region 200 and the NMOS region 300). In other words, the same high-K dielectric material 94 and the same interface material 96 may be used as the gate dielectric materials for both PMOS devices and NMOS devices. In contrast, previous designs may have to use different gate dielectric materials for P-type devices and N-type devices, which may necessitate the use of multiple mask layers and different optical masks to shield one region (e.g., PMOS region 200) of the substrate 50 while gate dielectric materials for another region (e.g., NMOS region 300) is being deposited. The presently disclosed gate dielectric materials (e.g., 94 and 96), however, may be formed at the same time (e.g., in a same deposition process) in both the PMOS region and the NMOS region, thus improving the scalability of the manufacturing process, and reducing the number of processing steps, the processing time, and the production cost (e.g., mask layers and optical masks used).

Figure 12:
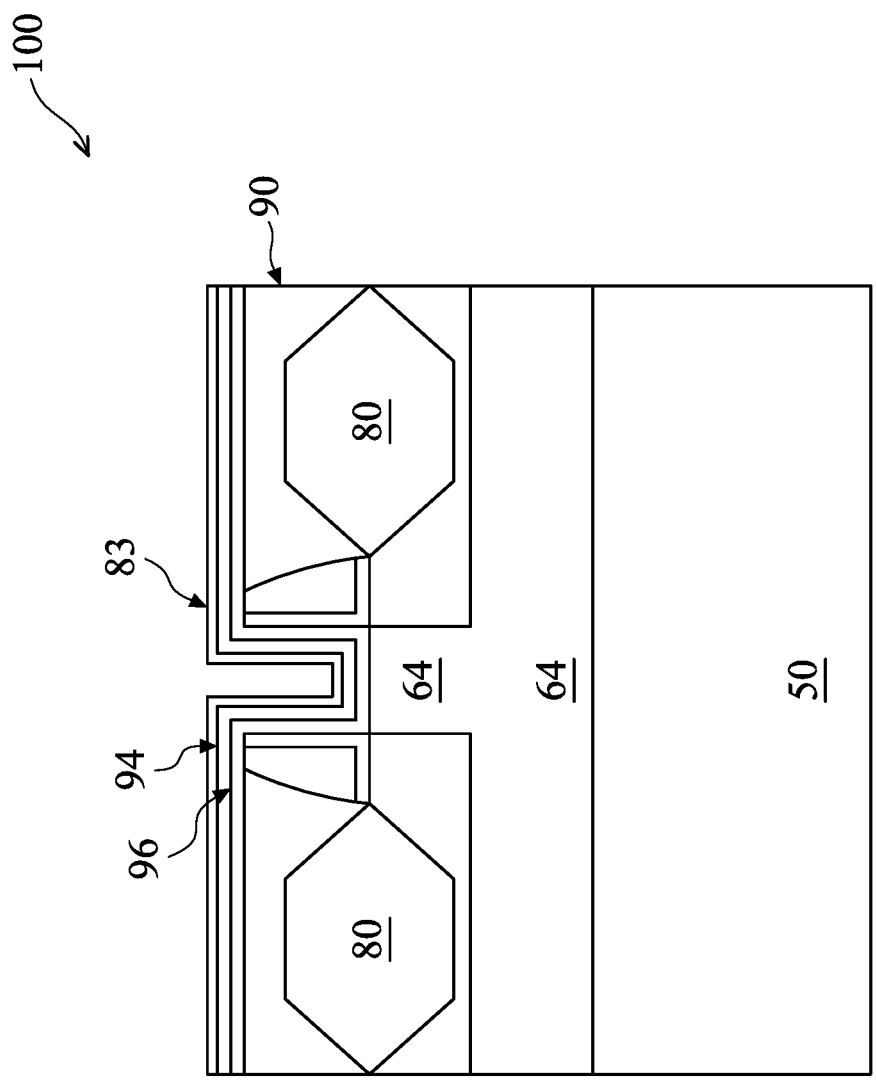

In some embodiments, the out-diffusion (e.g., toward the upper surface of the high-K dielectric material 94) of lanthanum and aluminum from the deposited dielectric layers 94B and 94C may cause contamination for subsequent processing. Therefore, a cleaning processing may be performed to remove the out-diffused lanthanum and aluminum. To control the cleaning process, an etch stop layer 83, such as titanium nitride (TiN), is formed conformally over the high-K dielectric material 94 before the cleaning process is performed, as illustrated in FIG. 12.

Once the etch stop layer 83 is formed, a suitable cleaning process, such as a wet cleaning and/or a dry cleaning process, may be performed to remove the contaminants such as out diffused lanthanum and aluminum, which contaminants may be disposed above the dielectric layer 94C, such as in and/or above the etch stop layer 83. In accordance with an embodiment, the cleaning process comprises a first cleaning process, which may be a wet etch, followed by a second cleaning process, which may be a dry etch process. The etch stop layer 83 may be used to control (e.g., setting a stopping point for) the wet etch process, and the subsequent dry etch process may be used to remove the etch stop layer 83. The dry etch process may also be used to fine tune (e.g., reduce and adjust) the thickness of the dielectric layer 94C to a target value. The etch stop layer 83 is completely removed after the second cleaning process in accordance with some embodiments.

Figure 13:
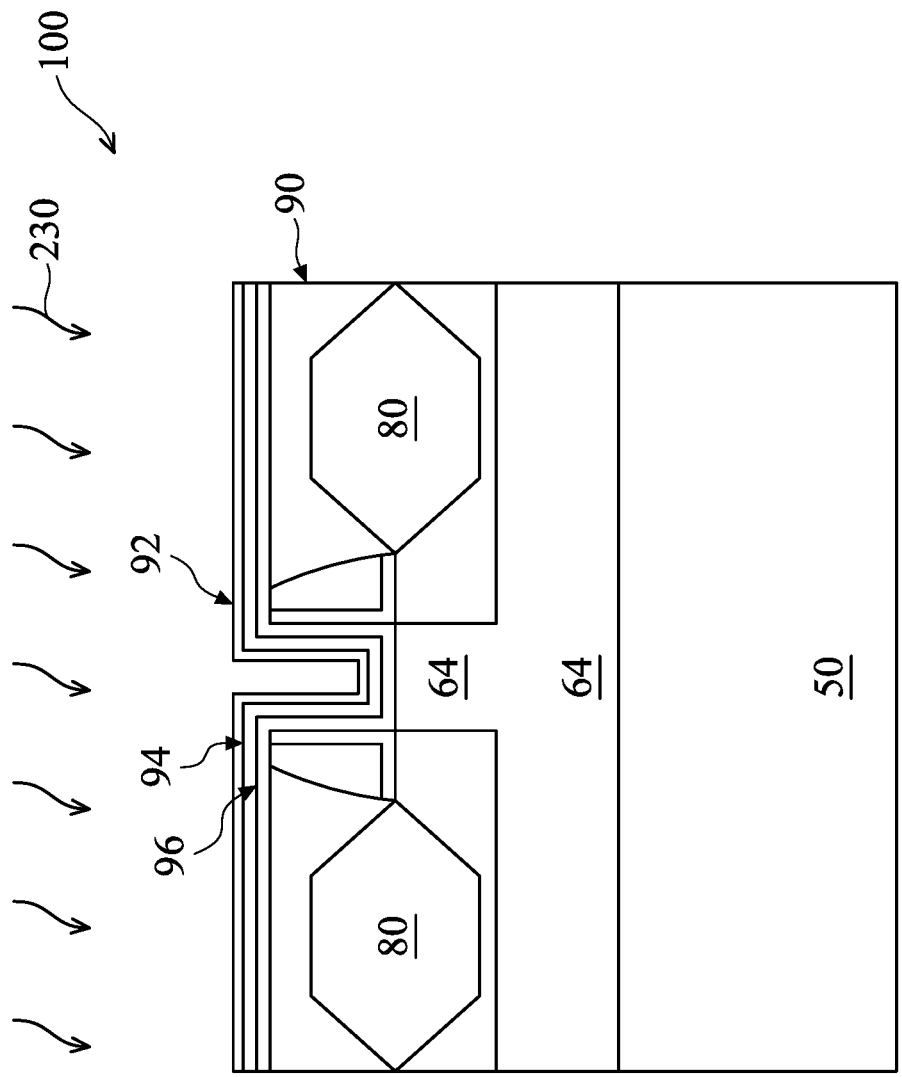

Next, as illustrated in FIG. 13, a capping layer 92 is conformally formed over the high-K dielectric material 94, and an anneal process 230 is performed after the capping layer 92 is formed. The capping layer comprises a suitable dielectric material such as titanium silicon nitride (TiSN), tantalum silicon nitride (TaSiN), or hafnium silicon oxynitride (HfSiON), and is formed by CVD, PVD, ALD, or other suitable deposition method, in some embodiments. The capping layer 92 may act as a glue layer between the high-K dielectric material 94 and its overlying layers (e.g., gate electrode 98, see FIG. 15). In addition, the capping layer 92 prevents or reduces the out-diffusion of lanthanum upwards toward the gate electrode 98. The capping layer 92 may also provide etching selectivity for subsequent processing. In some embodiments, a thickness of the capping layer 92 is in a range from about 1 nm to about 2 nm.

Still referring to FIG. 13, the anneal process 230 is performed at a temperature in a range from about 600° C. to about 800° C., for a duration between about 30 minutes and about 60 minutes, in some embodiments. In some embodiments, the anneal process 230 is a rapid thermal anneal process which is performed at a temperature between about 900° C. to about 1000° C., for a duration of about 3 seconds to about 5 seconds. The anneal process 230 stabilizes the previously deposited gate dielectric materials (e.g., 94 and 96) before further processing is performed, in some embodiments.

Figure 14:
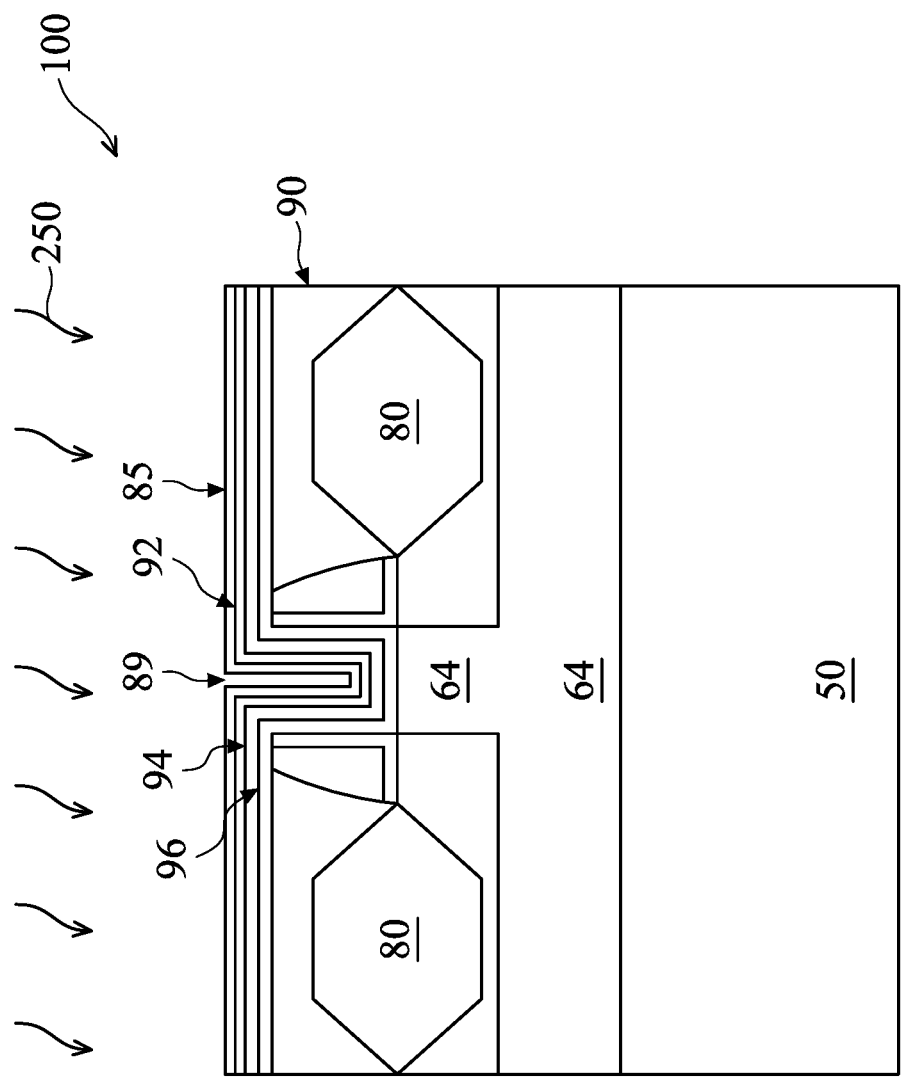

Next, in FIG. 14, a silicon capping layer 85 is formed conformally over the capping layer 92, followed by an anneal process 250. The silicon capping layer 85 comprises a layer of silicon with a thickness in a range from about 300 angstroms to about 500 angstroms, and may be formed by ALD, PVD, CVD, or other suitable deposition method. The silicon capping layer 85 helps to maintain the EOT after one or more subsequent high temperature annealing processes.

In some embodiments, the anneal process 250 is a rapid thermal anneal process which is performed at a temperature between about 800° C. to about 1000° C., for a duration of about 3 seconds to about 15 seconds. The rapid thermal anneal process may be a flash anneal, a laser anneal, or a microwave anneal. The anneal process 250 further stabilizes the previously deposited gate dielectric materials before additional processing is performed, in some embodiments.

Figure 15:
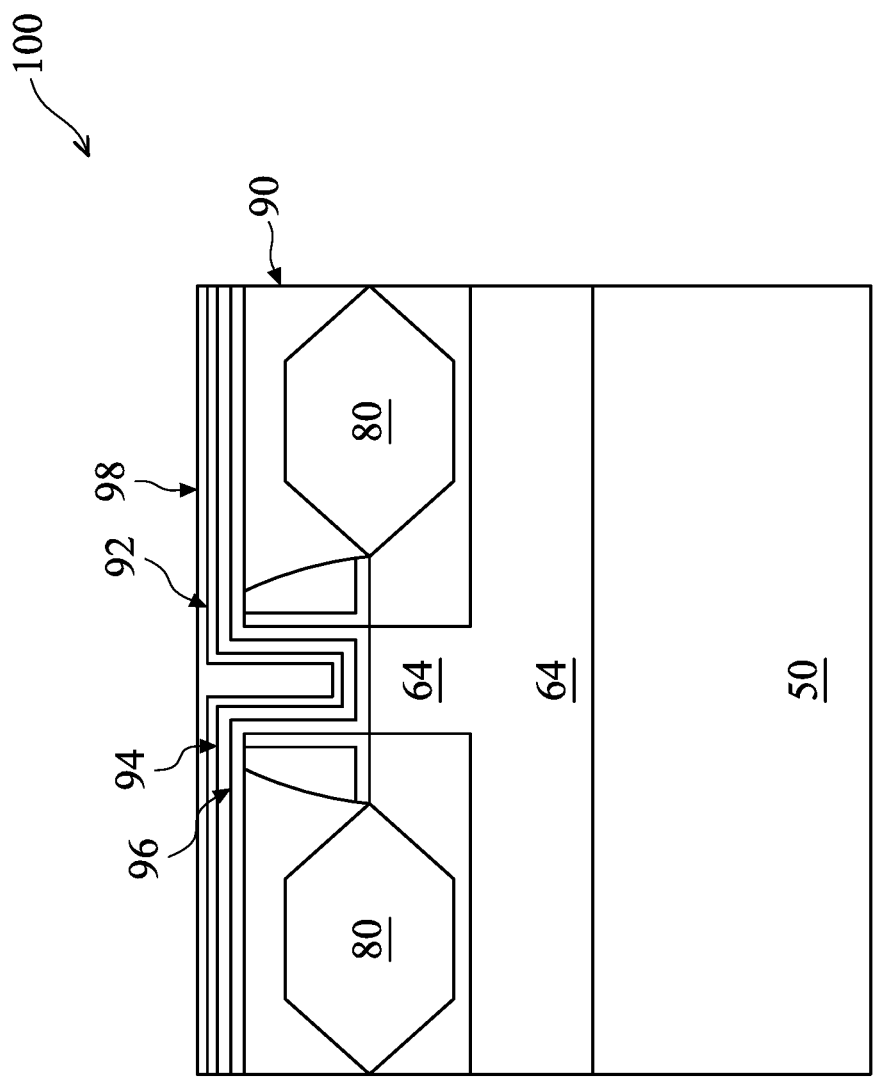

Next, in FIG. 15, the silicon capping layer 85 is removed by, e.g., a wet etch or a dry etch, and a gate electrode layer 98 is deposited to fill the recess 89 (see FIG. 14) to form the gate electrode of semiconductor device 100. Although not shown in FIG. 15, a barrier layer may be formed conformally over the capping layer 92 before the gate electrode layer 98 is formed.

In some embodiments, the barrier layer may comprise an electrically conductive material such as titanium nitride, although other materials, such as tantalum nitride, titanium, tantalum, or the like, may alternatively be utilized. The barrier layer may be formed using a CVD process, such as plasma-enhanced CVD (PECVD). However, other alternative processes, such as sputtering or metal organic chemical vapor deposition (MOCVD), atomic layer deposition (ALD), may alternatively be used.

Once the barrier layer is formed, the gate electrode layer 98 is deposited over the barrier layer, and fills the remaining portions of the recess 89. The gate electrode layer 98 may be made of a metal-containing material such as TiN, TaN, TaC, Co, Ru, Al, combinations thereof, or multi-layers thereof, and may be formed by, e.g., electroplating, electroless plating, or other suitable method.

Figure 16:
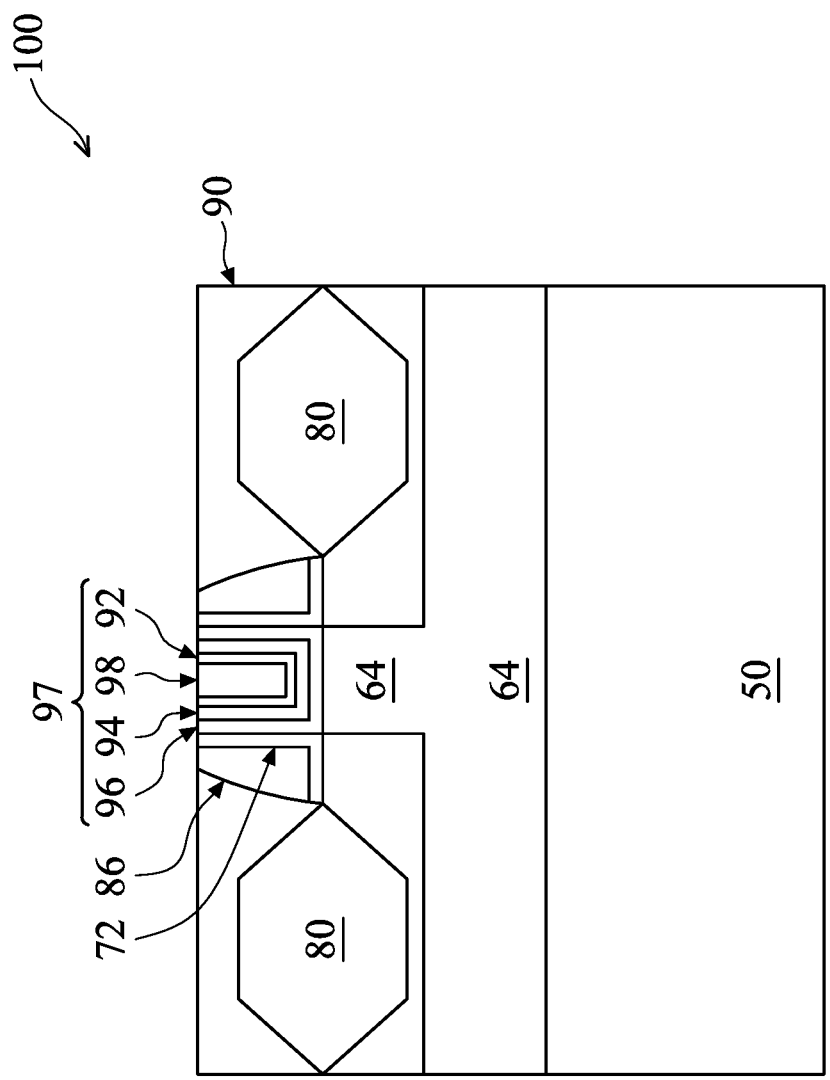

Next, as illustrated in FIG. 16, after the formation of the gate electrode layer 98, a planarization process, such as a CMP, may be performed to remove the excess portions of the interface material 96, the high-K dielectric material 94, the capping layer 92, the barrier layer, and the gate electrode layer 98, which excess portions are over the top surface of the first ILD 90. The resulting remaining portions of material of the gate electrode layer 98, the barrier layer, the capping layer 92, the high-K dielectric material 94, and the interface material 96 thus form a replacement gate 97 of the resulting FinFET device 100.

Figure 17:
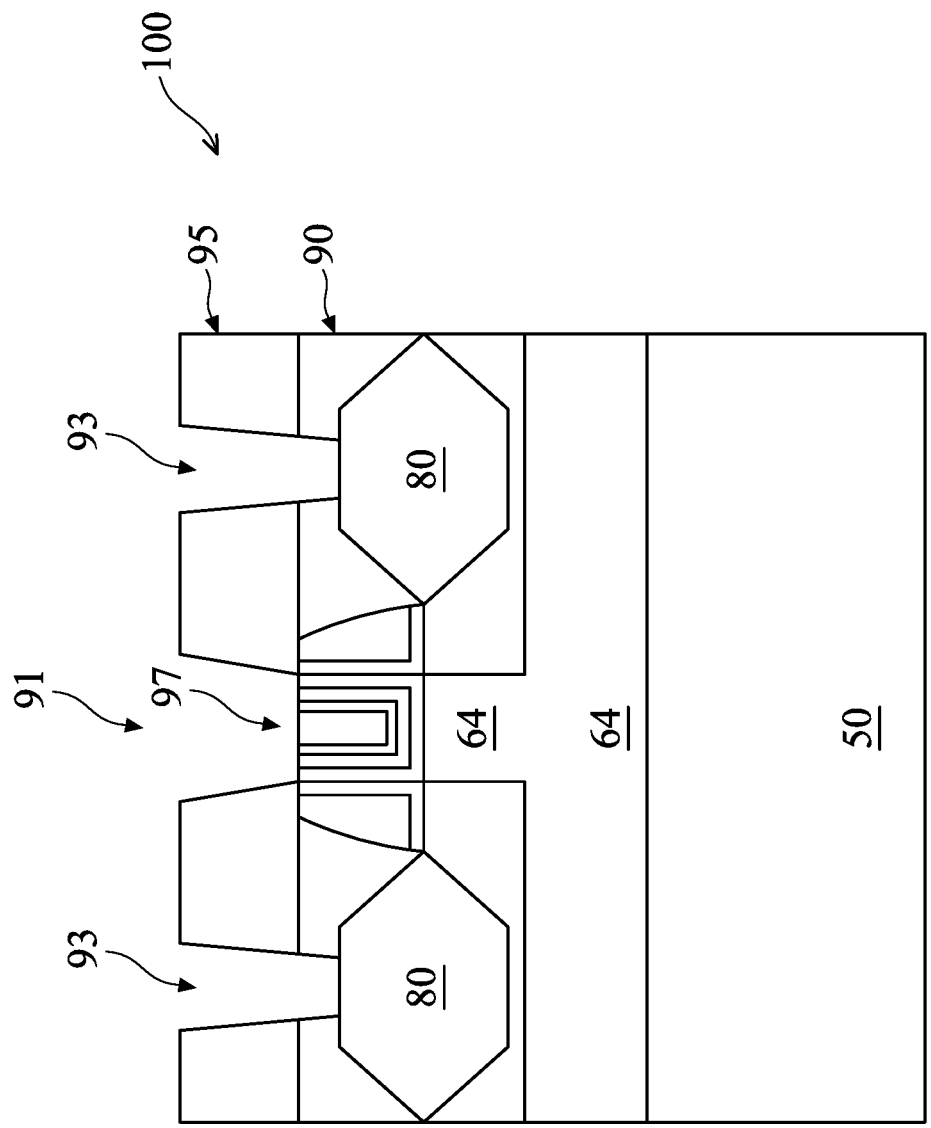

Next, in FIG. 17, a second ILD 95 is deposited over the first ILD 90. In an embodiment, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD and PECVD. Contact openings 91 and 93 for contacts 102 (see FIG. 20) are formed through the first ILD 90 and/or the second ILD 95. For example, the contact opening 91 is formed through the second ILD 95 and exposes the replacement gate 97, while the contact openings 93 are formed through the first ILD 90 and the second ILD 95, and exposes source/drain regions 80.

Figure 18:
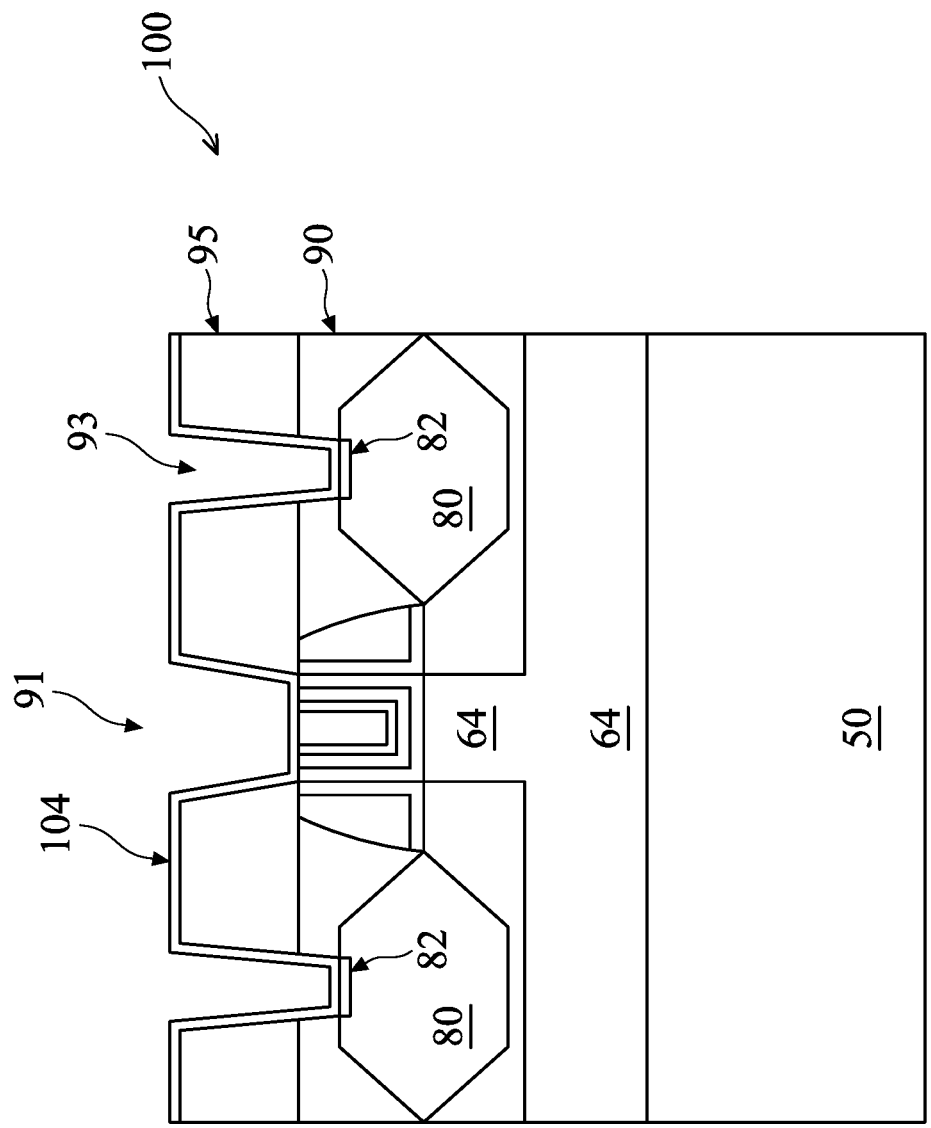

Next, in FIG. 18, silicide regions 82 are formed over the source/drain regions 80, and a barrier layer 104 is formed over the silicide regions 82 and the second ILD 95. In some embodiments, the silicide regions 82 are formed by depositing, over the source/drain regions 80, a metal capable of reacting with semiconductor materials (e.g., silicon, germanium) to form silicide or germanide regions. The metal may be nickel, cobalt, titanium, tantalum, platinum, tungsten, other noble metals, other refractory metals, rare earth metals or their alloys. A thermal anneal process is then performed so that the deposited metal reacts with the source/drain regions 80 to form silicide regions 82. After the thermal anneal process, the unreacted metal is removed.

The barrier layer 104 is conformally formed over the silicide regions 82 and the second ILD 95, and lines sidewalls and bottoms of the contact openings 91/93. The barrier layer 104 may comprise an electrically conductive material such as titanium (Ti), titanium nitride (TiN), tantalum (Ta), tantalum nitride (TaN), or the like, and may be formed using a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used.

Figure 19:
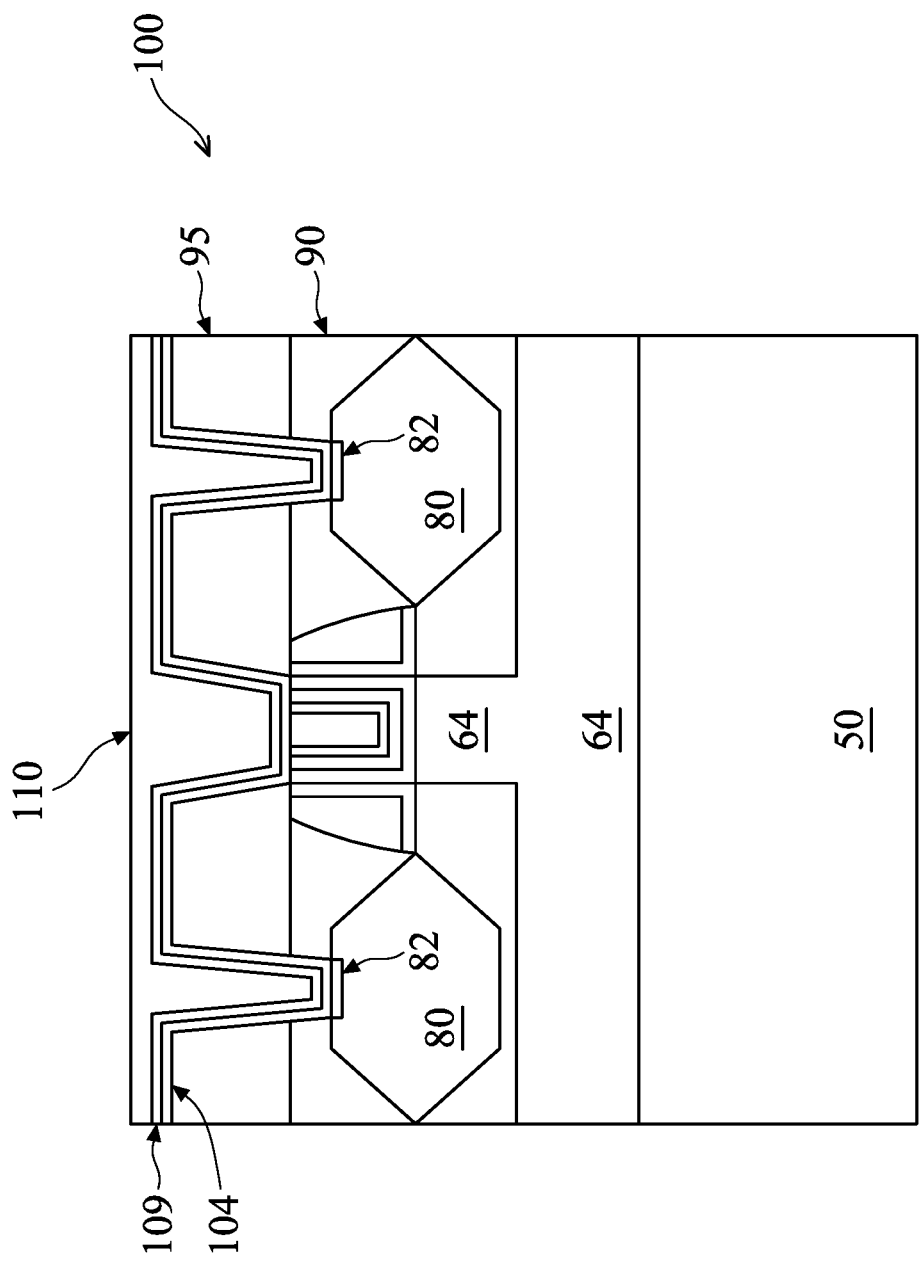

Next, in FIG. 19, a seed layer 109 is formed over the barrier layer 104, and an electrically conductive material 110 is formed over the seed layer 109. The seed layer 109 may be deposited by PVD, ALD or CVD, and may be formed of tungsten, copper, or copper alloys, although other suitable methods and materials may alternatively be used.

Once the seed layer 109 has been formed, the conductive material 110 may be formed onto the seed layer 109 to fill the contact openings 91/93. The conductive material 110 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 110.

Figure 20:
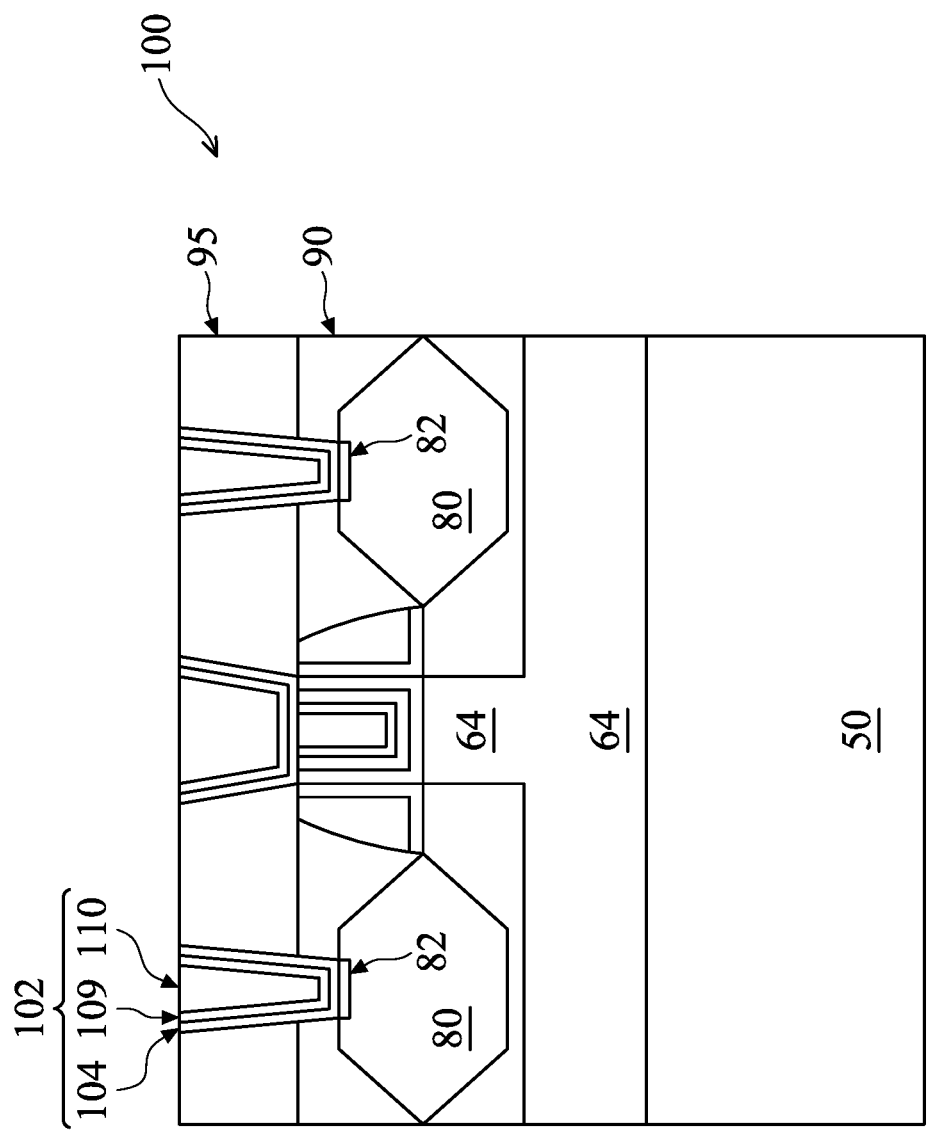

Referring next to FIG. 20, once the contact openings 91/93 have been filled, excess barrier layer 104, seed layer 109, and conductive material 110 outside of the contact openings 91/93 may be removed through a planarization process such as CMP, although any suitable removal process may be used. Contact plugs 102 are thus formed in the contact openings 91/93.

Figure 21:
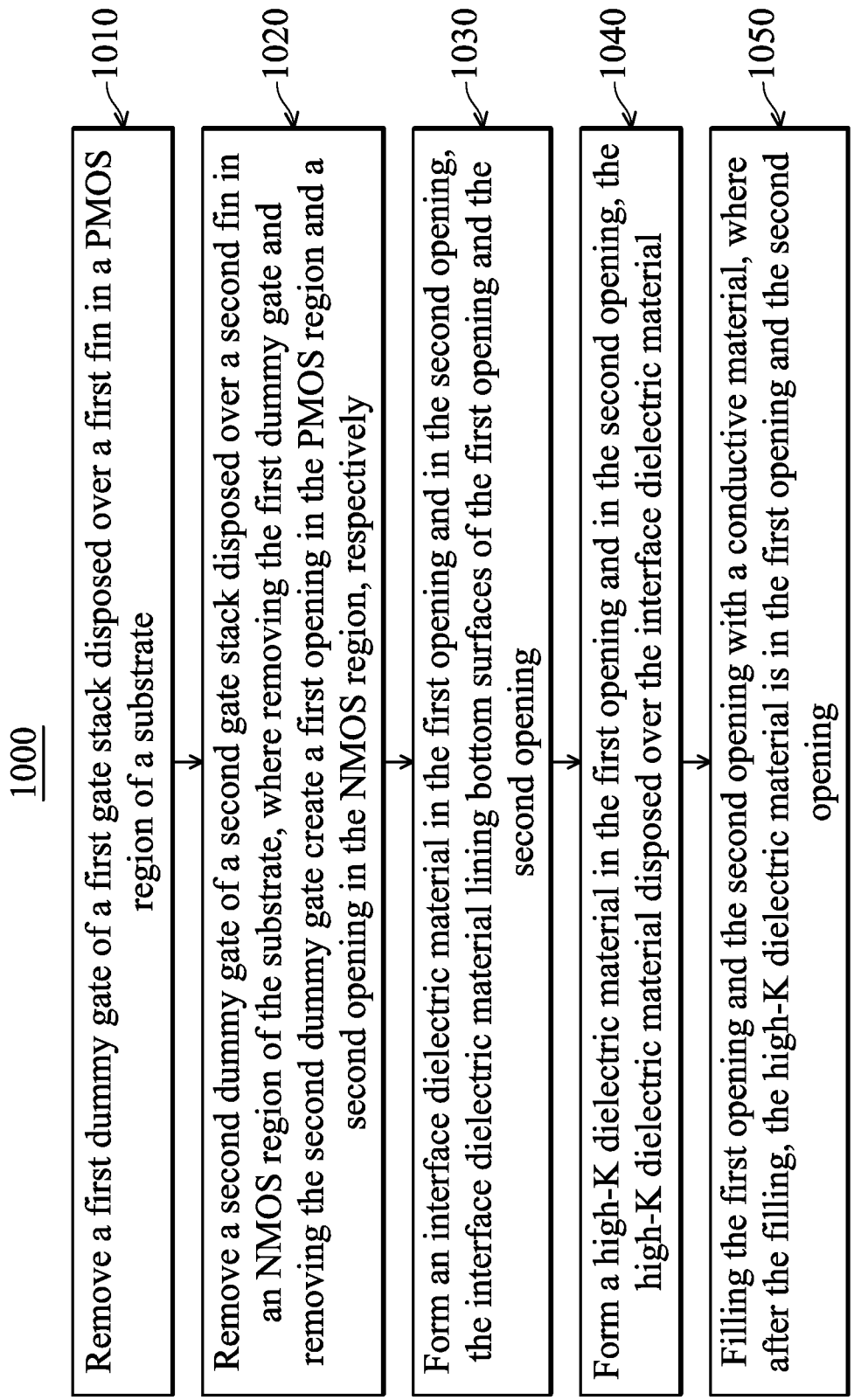
FIG. 21 illustrates a flow chart of a method for forming a gate dielectric material, in accordance with some embodiments.

FIG. 21 illustrates a flow chart of a method of forming a gate dielectric material, in accordance with some embodiments. It should be understood that the embodiment method shown in FIG. 21 is merely an example of many possible embodiment methods. One of ordinary skill in the art would recognize many variations, alternatives, and modifications. For example, various steps as illustrated in FIG. 21 may be added, removed, replaced, rearranged and repeated.

Referring to FIG. 21, at step 1010, a first dummy gate of a first gate stack disposed over a first fin in a PMOS region of a substrate is removed. At step 1020, a second dummy gate of a second gate stack disposed over a second fin in an NMOS region of the substrate is removed, where removing the first dummy gate and removing the second dummy gate create a first opening in the PMOS region and a second opening in the NMOS region, respectively. A step 1030, an interface dielectric material is formed in the first opening and in the second opening, the interface dielectric material lining bottom surfaces of the first opening and the second opening. At step 1040, a high-K dielectric material is formed in the first opening and in the second opening, the high-K dielectric material disposed over the interface dielectric material. At step 1050, the first opening and the second opening are filled with a conductive material, where after the filling, the high-K dielectric material is in the first opening and the second opening.

Embodiments may achieve advantages. The high-K dielectric stack in the present disclosure achieves low EOT (e.g., 0.5 nm or less), better threshold voltage (Vt) shift, and lower leakage current for the semiconductor device formed. In addition, the high-K dielectric stack is strong and resistant to moisture. Furthermore, contamination due to out-diffusion of lanthanum is well controlled by having the dielectric layer 94A (e.g., $HfO_2$) and the capping layer 92 in the gate dielectric material as the diffusion barriers for lanthanum. As a result of the selection of the materials for the gate dielectric and the design of the high-K dielectric stack, the same gate dielectric (e.g., the same high-K dielectric material 94 and the same interface material 96) can be used for both PMOS region and NMOS region, which reduces the cost of production. For example, no extra mask is needed for separately forming different gate dielectric materials in the PMOS region and the NMOS region, and therefore, processing time and the number of processing steps are also reduced. Since lanthanum allows for switching of dipole for metal work function, the presently disclosed high-K dielectric stack achieves a dipole interface that could modulate the metal effective work function. In some embodiments, transistors operate the same way every time as they switch due to this material property, which may produce interface dipoles.

A method of forming a gate dielectric material includes forming a high-K dielectric material in a first region over a substrate, where forming the high-K dielectric material includes forming a first dielectric layer comprising hafnium over the substrate, and forming a second dielectric layer comprising lanthanum over the first dielectric layer. In an embodiment, the first dielectric layer comprises hafnium lanthanum oxide. In an embodiment, the second dielectric layer comprises lanthanum aluminum oxide. In an embodiment, forming the high-K dielectric material further includes forming a third dielectric layer comprising hafnium oxide under the first dielectric layer, where the first dielectric layer is between the third dielectric layer and the second dielectric layer. In an embodiment, the method further includes forming an interface material under the high-K dielectric material and in the first region, where the interface material is between the high-K dielectric material and the substrate, where forming the interface material includes forming a fourth dielectric layer including an oxide of the substrate, and forming a fifth dielectric layer including a hafnium doped material of the fourth dielectric layer, where the fifth dielectric layer is between the fourth dielectric layer and the high-K dielectric material. In an embodiment, the fourth dielectric layer includes silicon oxide, and the fifth dielectric layer includes hafnium silicate. In an embodiment, the method further includes forming a capping layer including titanium silicon nitride over the high-K dielectric material. In an embodiment, the method further includes performing a first anneal process after forming the capping layer. In an embodiment, the method further includes forming a silicon capping layer over the capping layer, performing a second anneal process after forming the silicon capping layer, and removing the silicon capping layer after the second anneal process. In an embodiment, forming the high-K dielectric material further includes forming the high-K dielectric material in a second region over the substrate, where the first region is a PMOS region, and the second region is an NMOS region.

A method of forming a Fin Field-Effect (FinFET) device includes removing a first dummy gate of a first gate stack disposed over a first fin in a PMOS region of a substrate, and removing a second dummy gate of a second gate stack disposed over a second fin in an NMOS region of the substrate, where removing the first dummy gate and removing the second dummy gate create a first opening in the PMOS region and a second opening in the NMOS region, respectively. The method also includes forming an interface dielectric material in the first opening and in the second opening, the interface dielectric material lining bottom surfaces of the first opening and the second opening, forming a high-K dielectric material in the first opening and in the second opening, the high-K dielectric material disposed over the interface dielectric material, and filling the first opening and the second opening with a conductive material, where after the filling, the high-K dielectric material is in the first opening and the second opening. In an embodiment, the method further includes forming a capping layer over the high-K dielectric material in the first opening and in the second opening before filling the first opening and the second opening. In an embodiment, the method further includes forming a barrier layer over the capping layer, where the barrier layer is between the capping layer and the conductive material after the filling. In an embodiment, the interface dielectric material is formed in the first opening and the second opening at a same time, and the high-K dielectric material is formed in the first opening and the second opening at a same time. In an embodiment, forming the interface dielectric material includes forming a first dielectric layer including silicon oxide in the first opening and in the second opening, and forming a second dielectric layer including hafnium silicate over the first dielectric layer in the first opening and in the second opening. In an embodiment, forming the high-K dielectric material includes forming a third dielectric layer comprising hafnium oxide over the second dielectric layer, forming a fourth dielectric layer comprising hafnium lanthanum oxide over the third dielectric layer, and forming a fifth dielectric layer comprising lanthanum aluminum oxide over the fourth dielectric layer.

A semiconductor device includes a substrate and a first transistor in a first region of the substrate. The first transistor includes a first high-K dielectric material over the substrate, where the first high-K dielectric material includes a first dielectric layer including hafnium oxide over the substrate, a second dielectric layer including hafnium lanthanum oxide over the first dielectric layer, and a third dielectric layer including lanthanum aluminum oxide over the second dielectric layer. The first transistor further includes a first capping layer over the first high-K dielectric material, and a first gate electrode over the first capping layer. In an embodiment, the first transistor further comprises a first interface material between the first high-K dielectric material and the substrate, where the first interface material includes a fourth dielectric layer including silicon oxide over the substrate, and a fifth dielectric layer including hafnium silicate over the fourth dielectric layer. In an embodiment, the first capping layer includes titanium silicon nitride, tantalum silicon nitride, or hafnium silicon oxynitride. In an embodiment, the semiconductor device further includes a second transistor in a second region of the substrate, where the first transistor is a P-type transistor, and the second transistor is an N-type transistor, where the second transistor includes a second high-K dielectric material over the substrate, where the second high-K dielectric material is the same as the first high-K dielectric material, a second capping layer over the second high-K dielectric material, and a second gate electrode over the second capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a gate dielectric material, the method comprising:
    forming an interface material in a first region over a substrate; and
    forming a high-K dielectric material having an effective oxide thickness of 0.5 nm or less in the first region over the interface material, wherein forming the high-K dielectric material comprises:
        forming a first dielectric layer comprising hafnium oxide;
        after forming the first dielectric layer, forming a second dielectric layer comprising hafnium lanthanum oxide directly on the first dielectric layer; and
        after forming the second dielectric layer, forming a third dielectric layer comprising lanthanum aluminum oxide directly on the second dielectric layer.

2. The method of claim 1, wherein forming the interface material comprises:
    forming a fourth dielectric layer comprising an oxide of the substrate; and
    forming a fifth dielectric layer comprising a hafnium doped material of the fourth dielectric layer, wherein the fifth dielectric layer is between the fourth dielectric layer and the high-K dielectric material.

3. The method of claim 2, wherein the fourth dielectric layer comprises silicon oxide, and the fifth dielectric layer comprises hafnium silicate.

4. The method of claim 1, further comprising forming a capping layer comprising titanium silicon nitride over the high-K dielectric material.

5. The method of claim 4, further comprising performing a first anneal process after forming the capping layer.

6. The method of claim 5, further comprising:
forming a silicon capping layer over the capping layer;
performing a second anneal process after forming the silicon capping layer; and
removing the silicon capping layer after the second anneal process.

7. The method of claim 1, wherein forming the high-K dielectric material further comprises forming the high-K dielectric material in a second region over the substrate, wherein the first region is a PMOS region, and the second region is an NMOS region.

8. The method of claim 1, wherein the thickness of the first dielectric layer is in a range from about 0.5 nm to about 5 nm.

9. A method of forming a Fin Field-Effect (FinFET) device, the method comprising:
removing a first dummy gate of a first gate stack disposed over a first fin in a PMOS region of a substrate;
removing a second dummy gate of a second gate stack disposed over a second fin in an NMOS region of the substrate, wherein removing the first dummy gate and removing the second dummy gate create a first opening in the PMOS region and a second opening in the NMOS region, respectively;
forming an interface dielectric material in the first opening and in the second opening, the interface dielectric material lining bottom surfaces of the first opening and the second opening;
forming a high-K dielectric material having an effective oxide thickness of 0.5 nm or less in the first opening and in the second opening, the high-K dielectric material disposed over the interface dielectric material, comprising forming a hafnium oxide layer, after forming the hafnium oxide layer forming a hafnium lanthanum oxide layer directly on the hafnium oxide layer, and after forming the hafnium lanthanum oxide layer, forming a lanthanum aluminum oxide layer directly on the hafnium lanthanum oxide layer; and
filling the first opening and the second opening with a conductive material, wherein after the filling, the high-K dielectric material is in the first opening and the second opening.

10. The method of claim 9, further comprising forming a capping layer over the high-K dielectric material in the first opening and in the second opening before filling the first opening and the second opening.

11. The method of claim 10, further comprising forming a barrier layer over the capping layer, wherein the barrier layer is between the capping layer and the conductive material after the filling.

12. The method of claim 9, wherein the interface dielectric material is formed in the first opening and the second opening at a same time, and the high-K dielectric material is formed in the first opening and the second opening at a same time.

13. The method of claim 9, wherein forming the interface dielectric material comprises:
forming a first dielectric layer comprising silicon oxide in the first opening and in the second opening; and
forming a second dielectric layer comprising hafnium silicate over the first dielectric layer in the first opening and in the second opening.

14. The method of claim 9, wherein the thickness of the hafnium oxide layer is in a range from about 0.5 nm to about 5 nm.

15. The method of claim 9, wherein the thickness of the hafnium lanthanum oxide layer is in a range from about 0.5 nm to about 2 nm.

16. A method of forming a semiconductor device comprising:
forming a first transistor in a first region of a substrate, where forming the first transistor comprises:
forming a first interface material over the substrate;
forming a first high-K dielectric material having an effective oxide thickness of 0.5 nm or less over the first interface material, wherein forming the first high-K dielectric material comprises:
forming a first dielectric layer comprising hafnium oxide over the substrate;
after forming the first dielectric layer, forming a second dielectric layer comprising hafnium lanthanum oxide directly in contact with the first dielectric layer; and
after forming the second dielectric layer, forming a third dielectric layer comprising lanthanum aluminum oxide directly in contact with the second dielectric layer;
forming a first capping layer over the first high-K dielectric material; and
forming a first gate electrode over the first capping layer.

17. The method of claim 16, wherein forming the first interface material comprises:
forming a fourth dielectric layer comprising silicon oxide over the substrate; and
forming a fifth dielectric layer comprising hafnium silicate over the fourth dielectric layer.

18. The method of claim 16, wherein the first capping layer is formed of titanium silicon nitride, tantalum silicon nitride, or hafnium silicon oxynitride.

19. The method of claim 16, further comprising forming a second transistor in a second region of the substrate, wherein the first transistor is a P-type transistor, and the second transistor is an N-type transistor, wherein forming the second transistor comprises:
forming a second high-K dielectric material over the substrate, wherein the second high-K dielectric material is the same as the first high-K dielectric material;
forming a second capping layer over the second high-K dielectric material; and
forming a second gate electrode over the second capping layer.

20. The method of claim 16, wherein the thickness of the second dielectric layer is in a range from about 0.5 nm to about 2 nm.

* * * * *